United States Patent
Son et al.

(10) Patent No.: US 11,757,437 B2
(45) Date of Patent: Sep. 12, 2023

(54) MONOTONIC AND GLITCH-FREE PHASE INTERPOLATOR AND COMMUNICATION DEVICE INCLUDING THE SAME

(71) Applicant: SAMSUNG ELECTRONICS CO., LTD., Suwon-si (KR)

(72) Inventors: Seuk Son, Seoul (KR); Hobin Song, Daejeon (KR); Nakwon Lee, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 17/463,617

(22) Filed: Sep. 1, 2021

(65) Prior Publication Data

US 2022/0224318 A1 Jul. 14, 2022

(30) Foreign Application Priority Data

Jan. 8, 2021 (KR) .................. 10-2021-0002312

(51) Int. Cl.
*H03K 5/13* (2014.01)
*H03K 5/01* (2006.01)
(Continued)

(52) U.S. Cl.
CPC ............ *H03K 5/01* (2013.01); *G06F 1/06* (2013.01); *H03K 19/21* (2013.01); *H03M 7/165* (2013.01); *H03K 2005/00058* (2013.01)

(58) Field of Classification Search
CPC ............ H03K 5/01; H03K 19/21; H03K 2005/00058; H03K 5/1252; G06F 1/06;
(Continued)

(56) References Cited

U.S. PATENT DOCUMENTS 6,509,773 B2   1/2003   Buchwald et al.
7,034,734 B2   4/2006   Tseng
(Continued)

FOREIGN PATENT DOCUMENTS

KR       10122899     1/2013
KR       101226899    1/2013

OTHER PUBLICATIONS

Wei-Sheng Cheng et al., "A 10-bit Current-Steering DAC for HomePlug AV2 Powerline Communication System in 90nm CMOS", 2013 IEEE Xplore, pp. 2034-2037.
(Continued)

*Primary Examiner* — Ryan Jager
(74) *Attorney, Agent, or Firm* — Volentine, Whitt & Francos, PLLC

(57) ABSTRACT

A phase interpolator includes a decoder, a digital-to-analog converter (DAC), and a phase mixer. The decoder generates first and second thermometer codes and a selection signal based on a code. The DAC includes unit cells, determines two of weight signals as first and second target weight signals based on the selection signal, and adjusts a current of the first and second target weight signals by controlling the unit cells based on the first and second thermometer codes and the selection signal. The phase mixer determines two of input clock signals as first and second target clock signals and generates an output clock signal based on the first and second target weight signals and the first and second target clock signals. A phase of the output clock signal is between phases of the first and second target clock signals. The unit cells include different first and second unit cells.

17 Claims, 19 Drawing Sheets

(51) Int. Cl.
*H03K 19/21* (2006.01)
*G06F 1/06* (2006.01)
*H03M 7/16* (2006.01)
*H03K 5/00* (2006.01)

(58) Field of Classification Search
CPC ........ H03M 7/165; H03M 1/66; H03H 11/20; H03D 3/02
USPC ......................................................... 327/261
See application file for complete search history.

(56) References Cited

U.S. PATENT DOCUMENTS

| | | | |
|---|---|---|---|
| 7,423,469 B2 | 9/2008 | Pickering et al. | |
| 7,808,283 B2 | 10/2010 | Dani et al. | |
| 7,915,941 B1 | 3/2011 | Pan et al. | |
| 8,036,300 B2* | 10/2011 | Evans | H03L 7/0814 375/372 |
| 8,065,553 B2 | 11/2011 | Tamura et al. | |
| 8,760,332 B2 | 6/2014 | Lee | |
| 8,873,689 B2 | 10/2014 | Chung et al. | |
| 9,077,511 B2* | 7/2015 | Ponton | H03D 3/00 |
| 10,203,226 B1* | 2/2019 | Amiri | H03K 5/13 |
| 10,411,684 B2* | 9/2019 | Quek | H03M 1/86 |
| 2009/0195281 A1* | 8/2009 | Tamura | H04L 7/0337 327/163 |
| 2013/0314142 A1* | 11/2013 | Tamura | H03K 5/151 327/355 |
| 2015/0070201 A1* | 3/2015 | Dedic | H03M 1/0624 341/122 |
| 2018/0287821 A1* | 10/2018 | Klepser | H04L 27/0008 |
| 2019/0363723 A1* | 11/2019 | Wurzer | G11B 20/1426 |
| 2022/0224318 A1* | 7/2022 | Son | H03K 19/21 |

OTHER PUBLICATIONS

Chi-Hung Lin et al., "A 10-b, 500-MSample/s CMOS DAC in 0.6 mm2", IEEE Journal of Solid-State Circuits, vol. 33, No. 12, Dec. 1998, pp. 1948-1958.

* cited by examiner

FIG. 11A

| PI_CODE | SEL_IQ[1:0] | R[6:0] | C[2:0] |
|---|---|---|---|
| 0 | 11 | 000_0000 | 000 |
| 1 | 11 | 000_0000 | 001 |
| 2 | 11 | 000_0000 | 011 |
| 3 | 11 | 000_0000 | 111 |
| 4 | 11 | 000_0001 | 111 |
| 5 | 11 | 000_0001 | 011 |
| 6 | 11 | 000_0001 | 001 |
| 7 | 11 | 000_0001 | 000 |
| 8 | 11 | 000_0011 | 000 |
| 9 | 11 | 000_0011 | 001 |
| 10 | 11 | 000_0011 | 011 |
| 11 | 11 | 000_0011 | 111 |
| 12 | 11 | 000_0111 | 111 |
| 13 | 11 | 000_0111 | 011 |
| 14 | 11 | 000_0111 | 001 |
| 15 | 11 | 000_0111 | 000 |
| 16 | 11 | 000_1111 | 000 |
| 17 | 11 | 000_1111 | 001 |
| 18 | 11 | 000_1111 | 011 |
| 19 | 11 | 000_1111 | 111 |
| 20 | 11 | 001_1111 | 111 |
| 21 | 11 | 001_1111 | 011 |
| 22 | 11 | 001_1111 | 001 |
| 23 | 11 | 001_1111 | 000 |
| 24 | 11 | 011_1111 | 000 |
| 25 | 11 | 011_1111 | 001 |
| 26 | 11 | 011_1111 | 011 |
| 27 | 11 | 011_1111 | 111 |
| 28 | 11 | 111_1111 | 111 |
| 29 | 11 | 111_1111 | 011 |
| 30 | 11 | 111_1111 | 001 |
| 31 | 11 | 111_1111 | 000 |

FIG. 11B

| PI_CODE | SEL_IQ[1:0] | R[6:0] | C[2:0] |
|---|---|---|---|
| 32 | 10 | 111_1111 | 000 |
| 33 | 10 | 111_1111 | 001 |
| 34 | 10 | 111_1111 | 011 |
| 35 | 10 | 111_1111 | 111 |
| 36 | 10 | 011_1111 | 111 |
| 37 | 10 | 011_1111 | 011 |
| 38 | 10 | 011_1111 | 001 |
| 39 | 10 | 011_1111 | 000 |
| 40 | 10 | 001_1111 | 000 |
| 41 | 10 | 001_1111 | 001 |
| 42 | 10 | 001_1111 | 011 |
| 43 | 10 | 001_1111 | 111 |
| 44 | 10 | 000_1111 | 111 |
| 45 | 10 | 000_1111 | 011 |
| 46 | 10 | 000_1111 | 001 |
| 47 | 10 | 000_1111 | 000 |
| 48 | 10 | 000_0111 | 000 |
| 49 | 10 | 000_0111 | 001 |
| 50 | 10 | 000_0111 | 011 |
| 51 | 10 | 000_0111 | 111 |
| 52 | 10 | 000_0011 | 111 |
| 53 | 10 | 000_0011 | 011 |
| 54 | 10 | 000_0011 | 001 |
| 55 | 10 | 000_0011 | 000 |
| 56 | 10 | 000_0001 | 000 |
| 57 | 10 | 000_0001 | 001 |
| 58 | 10 | 000_0001 | 011 |
| 59 | 10 | 000_0001 | 111 |
| 60 | 10 | 000_0000 | 111 |
| 61 | 10 | 000_0000 | 011 |
| 62 | 10 | 000_0000 | 001 |
| 63 | 10 | 000_0000 | 000 |

FIG. 11C

| PI_CODE | SEL_IQ[1:0] | R[6:0] | C[2:0] |
|---|---|---|---|
| 64 | 00 | 000_0000 | 000 |
| 65 | 00 | 000_0000 | 001 |
| 66 | 00 | 000_0000 | 011 |
| 67 | 00 | 000_0000 | 111 |
| 68 | 00 | 000_0001 | 111 |
| 69 | 00 | 000_0001 | 011 |
| 70 | 00 | 000_0001 | 001 |
| 71 | 00 | 000_0001 | 000 |
| 72 | 00 | 000_0011 | 000 |
| 73 | 00 | 000_0011 | 001 |
| 74 | 00 | 000_0011 | 011 |
| 75 | 00 | 000_0011 | 111 |
| 76 | 00 | 000_0111 | 111 |
| 77 | 00 | 000_0111 | 011 |
| 78 | 00 | 000_0111 | 001 |
| 79 | 00 | 000_0111 | 000 |
| 80 | 00 | 000_1111 | 000 |
| 81 | 00 | 000_1111 | 001 |
| 82 | 00 | 000_1111 | 011 |
| 83 | 00 | 000_1111 | 111 |
| 84 | 00 | 001_1111 | 111 |
| 85 | 00 | 001_1111 | 011 |
| 86 | 00 | 001_1111 | 001 |
| 87 | 00 | 001_1111 | 000 |
| 88 | 00 | 011_1111 | 000 |
| 89 | 00 | 011_1111 | 001 |
| 90 | 00 | 011_1111 | 011 |
| 91 | 00 | 011_1111 | 111 |
| 92 | 00 | 111_1111 | 111 |
| 93 | 00 | 111_1111 | 011 |
| 94 | 00 | 111_1111 | 001 |
| 95 | 00 | 111_1111 | 000 |

FIG. 11D

| PI_CODE | SEL_IQ[1:0] | R[6:0] | C[2:0] |
|---|---|---|---|
| 96 | 01 | 111_1111 | 000 |
| 97 | 01 | 111_1111 | 001 |
| 98 | 01 | 111_1111 | 011 |
| 99 | 01 | 111_1111 | 111 |
| 100 | 01 | 011_1111 | 111 |
| 101 | 01 | 011_1111 | 011 |
| 102 | 01 | 011_1111 | 001 |
| 103 | 01 | 011_1111 | 000 |
| 104 | 01 | 001_1111 | 000 |
| 105 | 01 | 001_1111 | 001 |
| 106 | 01 | 001_1111 | 011 |
| 107 | 01 | 001_1111 | 111 |
| 108 | 01 | 000_1111 | 111 |
| 109 | 01 | 000_1111 | 011 |
| 110 | 01 | 000_1111 | 001 |
| 111 | 01 | 000_1111 | 000 |
| 112 | 01 | 000_0111 | 000 |
| 113 | 01 | 000_0111 | 001 |
| 114 | 01 | 000_0111 | 011 |
| 115 | 01 | 000_0111 | 111 |
| 116 | 01 | 000_0011 | 111 |
| 117 | 01 | 000_0011 | 011 |
| 118 | 01 | 000_0011 | 001 |
| 119 | 01 | 000_0011 | 000 |
| 120 | 01 | 000_0001 | 000 |
| 121 | 01 | 000_0001 | 001 |
| 122 | 01 | 000_0001 | 011 |
| 123 | 01 | 000_0001 | 111 |
| 124 | 01 | 000_0000 | 111 |
| 125 | 01 | 000_0000 | 011 |
| 126 | 01 | 000_0000 | 001 |
| 127 | 01 | 000_0000 | 000 |

FIG. 13

| | CASE1 | CASE2 | CASE3 | CASE4 |
|---|---|---|---|---|
| Number of Bits | 5 | 9 | 31 | 10 |
| Variance of DNL | $31\sigma^2$ | $7\sigma^2$ | $\sigma^2$ | $\sigma^2$ |
| Monotonicity | No | No | Yes | Yes |
| Glitch-free | No | No | Yes | Yes |

MONOTONIC AND GLITCH-FREE PHASE INTERPOLATOR AND COMMUNICATION DEVICE INCLUDING THE SAME

CROSS-REFERENCE TO RELATED APPLICATION

This application claims priority under 35 USC § 119 to Korean Patent Application No. 10-2021-0002312 filed on Jan. 8, 2021 in the Korean Intellectual Property Office (KIPO), the contents of which are herein incorporated by reference in their entirety.

BACKGROUND

1. Technical Field

Example embodiments relate generally to semiconductor integrated circuits and more particularly to phase interpolators with monotonic and glitch-free characteristics and communication devices including the phase interpolators.

2. Description of the Related Art

Despite improvements of speed of peripheral devices, such as memory, communication devices, or graphic devices and a data transmission rate, operating speeds of peripheral devices have not kept up with an operating speed of processors, in some cases. Further, a speed difference between new microprocessors and their peripheral devices is often present. Thus, some high performance digital systems have been required to dramatically improve speed of peripheral devices.

For example, like a data transmission between a memory device and a memory controller, in an input and output method of transmitting data by synchronizing a clock signal, a load of a bus increases and a transmission frequency becomes faster. Thus, it is very important to temporally synchronize the clock signal and data. To this end, a phase locked loop (PLL) circuit, a delay locked loop (DLL) circuit, etc. are used. The PLL and the DLL generally include a phase interpolator. The phase interpolator is a circuit that appropriately controls two selection delay clock signals of different phases and generates an optional delay clock signal between the two selection delay clock signals. The phase interpolator is used in various application circuits since it can precisely output a desired phase.

SUMMARY

At least one example embodiment of the present disclosure provides a phase interpolator including a digital-to-analog converter (DAC) controlled by two-dimensional thermometer codes and capable of having improved or enhanced performance At least one example embodiment of the present disclosure provides a communication device including the phase interpolator.

According to example embodiments, a phase interpolator includes a decoder, a digital-to-analog converter (DAC), and a phase mixer. The decoder generates a first thermometer code, a second thermometer code, and a selection signal based on a phase interpolation code. The digital-to-analog converter includes a plurality of unit cells that are arranged in a matrix formation including a plurality of rows and a plurality of columns, determines two of a plurality of weight signals as a first target weight signal and a second target weight signal based on the selection signal, and adjusts an amount of current of the first and second target weight signals by controlling the plurality of unit cells based on the first and second thermometer codes and the selection signal. The phase mixer determines two of a plurality of input clock signals as a first target clock signal and a second target clock signal corresponding to the first and second target weight signals and generates an output clock signal based on the first and second target weight signals and the first and second target clock signals. A phase of the output clock signal is between phases of the first and second target clock signals. The plurality of unit cells include a first unit cell and a second unit cell that are different types.

According to example embodiments, a communication device includes a phase interpolator and a data sampler. The phase interpolator generates a phase interpolation clock signal based on a phase interpolation code and a plurality of input clock signals. The data sampler generates sample data by sampling an input data stream based on the phase interpolation clock signal. The phase interpolator includes a decoder, a digital-to-analog converter (DAC), and a phase mixer. The decoder generates a first thermometer code, a second thermometer code, and a selection signal based on the phase interpolation code. The digital-to-analog converter includes a plurality of unit cells that are arranged in a matrix formation including a plurality of rows and a plurality of columns, determines two of a plurality of weight signals as a first target weight signal and a second target weight signal based on the selection signal, and adjusts an amount of current of the first and second target weight signals by controlling the plurality of unit cells based on the first and second thermometer codes and the selection signal. The phase mixer determines two of the plurality of input clock signals as a first target clock signal and a second target clock signal corresponding to the first and second target weight signals and generates the phase interpolation clock signal based on the first and second target weight signals and the first and second target clock signals. A phase of the phase interpolation clock signal is between phases of the first and second target clock signals. The plurality of unit cells include a first unit cell and a second unit cell that are different types.

According to example embodiments, a phase interpolator includes a decoder, a digital-to-analog converter (DAC), and a phase mixer. The decoder generates a first thermometer code of (X−1) bits, a second thermometer code of (Y−1) bits, and a selection signal of two bits based on a phase interpolation code, where each of X and Y is a natural number greater than or equal to two. The digital-to-analog converter includes X*Y unit cells that are arranged in a matrix formation including X rows and Y columns, determines two of a first weight signal, a second weight signal, a third weight signal, and a fourth weight signal as a first target weight signal and a second target weight signal based on the selection signal, and adjusts an amount of current of the first and second target weight signals by controlling the X*Y unit cells based on the first and second thermometer codes and the selection signal. The phase mixer determines two of a first input clock signal, a second input clock signal, a third input clock signal, and a fourth input clock signal as a first target clock signal and a second target clock signal corresponding to the first and second target weight signals and generates a phase interpolation clock signal by performing a phase interpolation operation on the first and second target clock signals based on the first and second target weight signals. Two adjacent input clock signals among the first, second, third, and fourth input clock signals have a phase difference of 90 degrees from each other. A phase of the phase interpolation clock signal is between phases of the first and second target clock signals. The X*Y unit cells include a first unit cell and a second unit cell that are different types, a number of the second unit cell is one, and a number of the first unit cell is (X*Y−1). The first unit cell operates based on all of the first and second thermometer codes and the selection signal and the second unit cell operates based on only the selection signal. The X*Y unit cells are always turned on and each of the X*Y unit cells is assigned to one of the first and second target weight signals based on at least one of the first and second thermometer codes and the selection signal.

The phase interpolator and the communication device according to example embodiments may include the digital-to-analog converter, which is controlled by the two-dimensional thermometer codes, to perform the phase interpolation operation on two input clock signals. Thus, the phase interpolator may have a relatively improved differential non-linearity (DNL) performance, the glitch-free characteristic, and the monotonic characteristic even when a control signal (or control code) having a relatively small number of bits is used. Accordingly, the phase interpolator may be implemented with a relatively small size and a relatively improved performance.

BRIEF DESCRIPTION OF THE DRAWINGS

Illustrative, non-limiting example embodiments will be more clearly understood from the following detailed description taken in conjunction with the accompanying drawings.

FIGS. 11A, 11B, 11C, 11D, 12 and 13 are diagrams for describing an operation of a phase interpolator of FIG. 2.

DETAILED DESCRIPTION OF THE EMBODIMENTS

Figure 1:
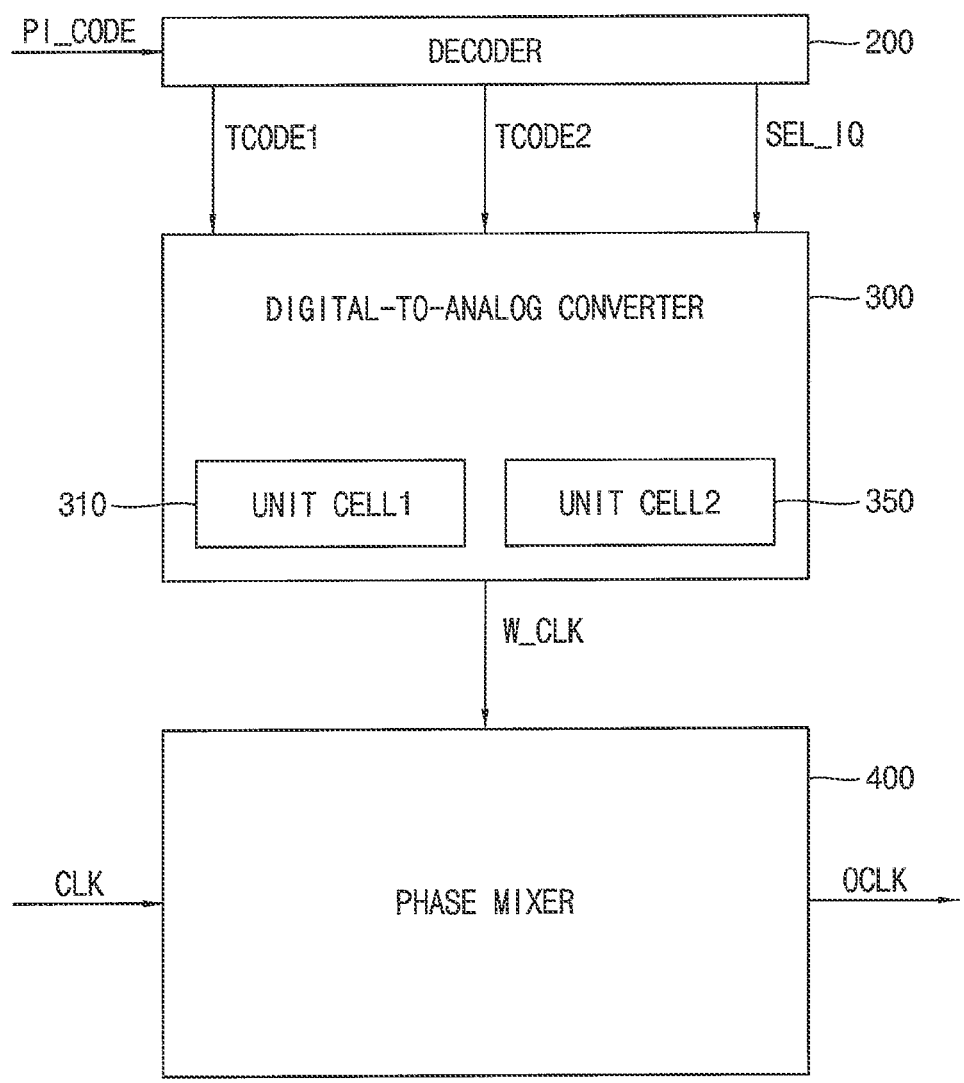
FIG. 1 is a block diagram illustrating a phase interpolator according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating a phase interpolator according to example embodiments.

Referring to FIG. 1, a phase interpolator 100 includes a decoder 200, a digital-to-analog converter (DAC) 300 and a phase mixer 400.

The decoder 200 generates a first thermometer code TCODE1, a second thermometer code TCODE2 and a selection signal SEL_IQ based on a phase interpolation code PI_CODE.

The phase interpolation code PI_CODE may be a code that represents the amount (or degree) of a phase interpolation operation performed by the phase mixer 400. The first and second thermometer codes TCODE1 and TCODE2 and the selection signal SEL_IQ may be used to control an operation of the digital-to-analog converter 300. The selection signal SEL_IQ may be a signal or digital code that is used to select two of a plurality of input clock signals CLK and to select two of a plurality of weight signals W_CLK corresponding to the selected input clock signals, and may be referred to as a clock selection signal.

The digital-to-analog converter 300 includes a plurality of unit cells 310 and 350 that are arranged in a matrix formation (e.g., a two-dimensional form) including a plurality of rows and a plurality of columns. The digital-to-analog converter 300 determines two of the plurality of weight signals W_CLK as a first target weight signal and a second target weight signal based on the selection signal SEL_IQ and adjusts and outputs the amount (or magnitude) of current of the first and second target weight signals by controlling the plurality of unit cells 310 and 350 based on the first and second thermometer codes TCODE1 and TCODE2 and the selection signal SEL_IQ. A detailed configuration of the digital-to-analog converter 300 will be described with reference to FIG. 4.

The plurality of weight signals W_CLK may be signals that are used to assign or allocate different weights to the selected input clock signals. As described above, the digital-to-analog converter 300 may include the plurality of unit cells 310 and 350 arranged in the two-dimensional form, may be controlled based on the two thermometer codes TCODE1 and TCODE2 to generate and output the selected weight signals, and thus may be referred to as a digital-to-analog converter controlled by two-dimensional thermometer codes.

Unlike a general digital-to-analog converter including a plurality of unit cells that are the same type, the digital-to-analog converter 300 that is included in the phase interpolator 100 according to example embodiments and is controlled by the two-dimensional thermometer codes may include the plurality of unit cells 310 and 350 that are different types. For example, the plurality of unit cells 310 and 350 may include a first unit cell 310 and a second unit cell 350 that are different types. For example, the first unit cell 310 may operate based on all of the first and second thermometer codes TCODE1 and TCODE2 and the selection signal SEL_IQ and the second unit cell 350 may operate based on only the selection signal SEL_IQ. Detailed configurations of the first and second unit cells 310 and 350 will be described with reference to FIGS. 5 through 9.

In addition, unlike a general digital-to-analog converter that performs a digital-to-analog conversion operation by selectively turning on and off a plurality of unit cells based on a control code, the digital-to-analog converter 300 that is included in the phase interpolator 100 according to example embodiments and is controlled by the two-dimensional thermometer codes may include the plurality of unit cells 310 and 350 all of which are always turned on. For example, the digital-to-analog converter 300 may perform a digital-to-analog conversion operation for a phase interpolation operation such that each of the plurality of unit cells 310 and 350 is assigned or allocated to one of the first and second target weight signals based on at least one of the first and second thermometer codes TCODE1 and TCODE2 and the selection signal SEL_IQ. Detailed operations of the plurality of unit cells 310 and 350 will be described later.

In some example embodiments, the number of the unit cells 310 and 350 and the number of bits of the first and second thermometer codes TCODE1 and TCODE2 may be correlated with each other and the number of bits of the first and second thermometer codes TCODE1 and TCODE2 may be set or determined based on the number of the plurality of unit cells 310 and 350. For example, the number of the plurality of rows and the number of the plurality of columns of the plurality of unit cells 310 and 350 may be X and Y, respectively, where each of X and Y is a natural number greater than or equal to two, and the total number of the plurality of unit cells 310 and 350 may be J (e.g., J=X*Y), where J is a natural number greater than or equal to four. In this example, when the first thermometer code TCODE1 is a row thermometer code applied to the plurality of rows and the second thermometer code TCODE2 is a column thermometer code applied to the plurality of columns, the number of bits of the first thermometer code TCODE1 and the number of bits of the second thermometer code TCODE2 may be (X−1) and (Y−1), respectively. In addition, among the plurality of unit cells 310 and 350, the number of the second unit cells 350 may be one and the number of the first unit cells 310 may be (J−1) (e.g., (X*Y)−1).

The phase mixer 400 determines two of the plurality of input clock signals CLK as a first target clock signal and a second target clock signal and generates an output clock signal OCLK based on the first and second target weight signals and the first and second target clock signals (e.g., by performing the phase interpolation operation on the first and second target clock signals based on the first and second target weight signals). The first and second target clock signals correspond to the first and second target weight signals, respectively, and a phase of the output clock signal is between phases of the first and second target clock signals. The output clock signal OCLK may be referred to as a phase interpolation clock signal. A detailed configuration of the phase mixer 400 will be described with reference to FIG. 10.

The phase interpolation operation may be used to generate a clock signal having phase ranges between the phases of two input clocks, which have phases different from each other. For example, a clock signal having a phase in the range of about 0 to 90 degrees may be generated using a clock signal having about 0 degree phase and another clock signal having about 90 degree phase. When the phase interpolation operation is used as described above, a clock signal synchronized with a data signal may be generated and provided within a relatively short time even if jitter occurs on the data signal transmitted with a relatively high speed.

The plurality of input clock signals CLK may have different phases, and the phases of the plurality of input clock signals CLK may partially overlap each other. For example, two adjacent input clock signals among the plurality of input clock signals CLK may be determined as the first and second target clock signals based on the selection signal SEL_IQ.

In some example embodiments, the number of the input clock signals CLK, the number of the weight signals W_CLK and the number of bits of the selection signal SEL_IQ may be correlated with each other, and the number of the weight signals W_CLK and the number of bits of the selection signal SEL_IQ may be determined based on the number of the input clock signals CLK. For example, the number of the plurality of input clock signals CLK may be $2^K$, where K is a natural number greater than or equal to one. In this example, the number of the plurality of weight signals W_CLK may be $2^K$ that is equal to the number of the plurality of input clock signals CLK, and the number of bits of the selection signal SEL_IQ may be K.

In some example embodiments, the phase interpolator 100 may have a glitch-free characteristic. The glitch-free characteristic may indicate that only one of: (1) a plurality of selection bits, (2) a plurality of first bits, and (3) a plurality of second bits is toggled or transitioned when the phase interpolation code PI_CODE sequentially increases or decreases.

The plurality of selection bits may be included in the selection signal SEL_IQ, the plurality of first bits may be included in the first thermometer code TCODE1 and may be referred to as a plurality of row bits, and the plurality of second bits may be included in the second thermometer code TCODE2 and may be referred to as a plurality of column bits. In other words, in the phase interpolator 100 having the glitch-free characteristic, only one of outputs of the decoder 200 (e.g., only one control bit) may be toggled when the phase interpolation code PI_CODE is changed.

In some example embodiments, the phase interpolator 100 may have a monotonic or monotonicity characteristic. The monotonic characteristic may represent that the number of unit cells assigned to the first target weight signal (or the second target weight signal) among the plurality of unit cells 310 and 350 increases or decreases by one when the phase interpolation code PI_CODE sequentially increases or decreases. In other words, in the phase interpolator 100 having the monotonic characteristic, only one unit cell (e.g., only one current source) may be added to a weight (e.g., to a corresponding weight signal) based on a thermometer scheme.

Figure 2:
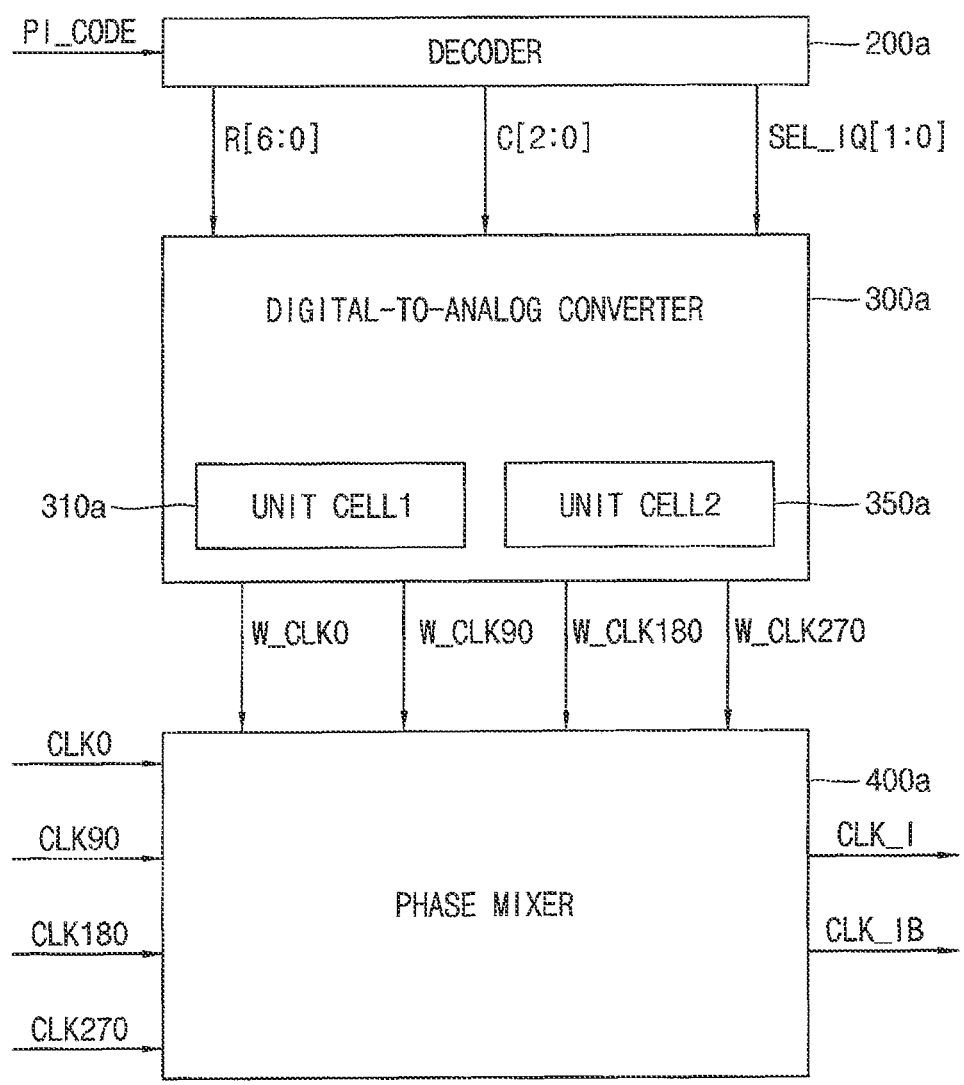
FIG. 2 is a block diagram illustrating an example of a phase interpolator of FIG. 1.

The phase interpolator 100 according to example embodiments may include the digital-to-analog converter 300, which is controlled by the two-dimensional thermometer codes, to perform the phase interpolation operation on two input clock signals. Thus, the phase interpolator 100 may have a relatively improved differential non-linearity (DNL) performance, the glitch-free characteristic, and the monotonic characteristic even when a control signal (or control code) having a relatively small number of bits is used. Accordingly, the phase interpolator 100 may be implemented with a relatively small size and a relatively improved performance FIG. 2 is a block diagram illustrating an example of a phase interpolator of FIG. 1. The descriptions repeated with FIG. 1 will be omitted.

Referring to FIG. 2, a phase interpolator 100a includes a decoder 200a, a digital-to-analog converter 300a, and a phase mixer 400a.

FIG. 2 illustrates an example where K=2, X=8, Y=4 and J=32 in the phase interpolator 100 of FIG. 1. For example, the plurality of input clock signals CLK may include a first input clock signal CLK0, a second input clock signal CLK90, a third input clock signal CLK180 and a fourth input clock signal CLK270. The plurality of weight signals W_CLK may include a first weight signal W_CLK0, a second weight signal W_CLK90, a third weight signal W_CLK180 and a fourth weight signal W_CLK270 that correspond to the first input clock signal CLK0, the second input clock signal CLK90, the third input clock signal CLK180, and the fourth input clock signal CLK270, respectively. A selection signal SEL_IQ[1:0] may include two selection bits. The digital-to-analog converter 300a may include a total of 8*4=32 unit cells. A first thermometer code R[6:0] may include seven row bits, and a second thermometer code C[2:0] may include three column bits.

The decoder 200a may generate the first thermometer code R[6:0] of 7 bits, the second thermometer code C[2:0] of 3 bits, and the selection signal SEL_IQ[1:0] of 2 bits based on the phase interpolation code PI_CODE. For example, the phase interpolation code PI_CODE may include a total of 128 values that are decimal numbers ranging from 0 to 127, and may generate a control code having a total of 12 bits based on the 128 values.

The digital-to-analog converter 300a may include a plurality of unit cells 310a and 350a, may select two of the first, second, third and fourth weight signals W_CLK0, W_CLK90, W_CLK180 and W_CLK270 based on the selection signal SEL_IQ[1:0], and may adjust and output the amount of current of the selected two weight signals by controlling the plurality of unit cells 310a and 350a based on the first thermometer code R[6:0], a second thermometer code C[2:0] and the selection signal SEL_IQ[1:0]. For example, the plurality of unit cells 310a and 350a may include a first unit cell 310a and a second unit cell 350a that are different types. The first and second unit cells 310a and 350a may correspond to the first and second unit cells 310 and 350 in FIG. 1, respectively. The number of the first and second unit cells 310a and 350a may be 31 and 1, respectively.

The phase mixer 400a may select two of the first, second, third and fourth input clock signals CLK0, CLK90, CLK180, and CLK270 and may generate an output clock signal CLK_I by performing the phase interpolation operation on the selected two input clock signals based on the selected two weight signals. The selected two input clock signals may correspond to the selected two weight signals, and the output clock signal CLK_I may have a phase between the selected two input clock signals. The phase mixer 400a may also generate an inversion output clock signal CLK_IB in which the output clock signal CLK_I is inverted. A pair of the differential output clock signals CLK_I and CLK_IB may be generated by or from the phase mixer 400a.

Two adjacent input clock signals among the first, second, third, and fourth input clock signals CLK0, CLK90, CLK180, and CLK270 may have a phase difference of about 90 degrees from each other. For example, a phase difference between the first and second input clock signals CLK0 and CLK90 may be about 90 degrees. Similarly, a phase difference between the second and third input clock signals CLK90 and CLK180 may be about 90 degrees, a phase difference between the third and fourth input clock signals CLK180 and CLK270 may be about 90 degrees, and a phase difference between the fourth and first input clock signals CLK270 and CLK0 may be about 90 degrees.

The output clock signal CLK_I may be generated based on the selected two input clock signals in two adjacent input clock signals are selected from among the first, second, third, and fourth input clock signals CLK0, CLK90, CLK180, and CLK270. For example, the output clock signal CLK_I may be generated based on the first and second input clock signals CLK0 and CLK90 and the first and second weight signals W_CLK0 and W_CLK90. For another example, the output clock signal CLK_I may be generated based on the second and third input clock signals CLK90 and CLK180 and the second and third weight signals W_CLK90 and W_CLK180. Alternatively, the output clock signal CLK_I may be generated based on the third and fourth input clock signals CLK180 and CLK270 and the third and fourth weight signals W_CLK180 and W_CLK270 or based on the fourth and first input clock signals CLK270 and CLK0 and the fourth and first weight signals W_CLK270 and W_CLK0.

Figure 3:
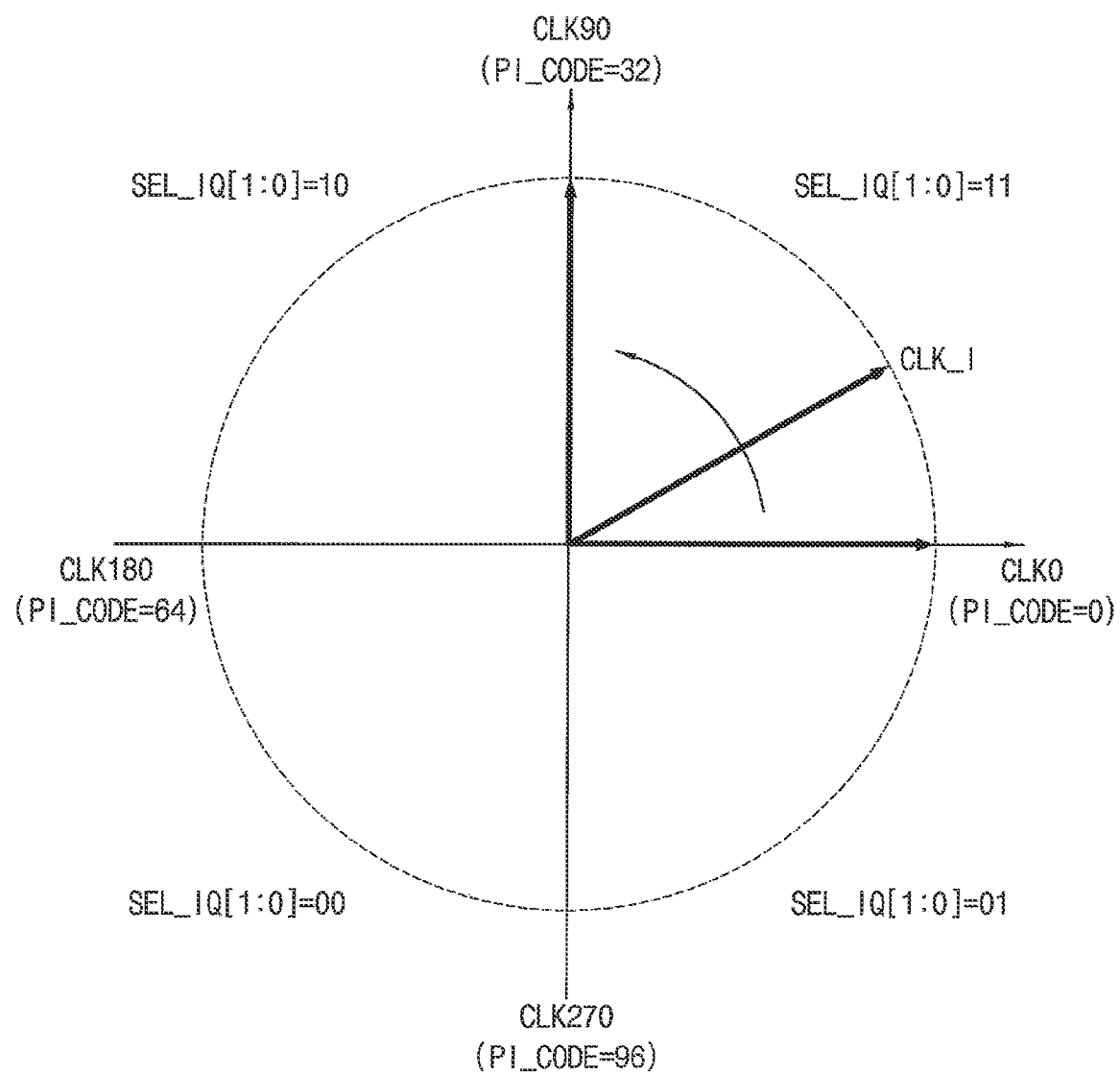
FIG. 3 is a diagram for describing an operation of a phase interpolator of FIG. 2.

FIG. 3 is a diagram for describing an operation of a phase interpolator of FIG. 2.

Referring to FIG. 3, when the phase interpolation code PI_CODE input to the phase interpolator 100a corresponds to one of decimal numbers ranging from 0 to 31, the selection signal (SEL_IQ[1:0]) may be decoded as "11" in binary and the first and second input clock signals CLK0 and CLK90 may be selected to perform the phase interpolation operation on a first quadrant. For example, the selection signal SEL_IQ[1:0] may be decoded as a Gray code. For example, the output clock signal CLK_I, having a phase substantially the same as that of the first input clock signal CLK0, may be generated when the phase interpolation code PI_CODE corresponds to zero in decimal and the output clock signal CLK_I having a phase increased by about 90/32 degrees with respect to the first input clock signal CLK0 may be generated whenever the phase interpolation code PI_CODE increases by one.

Similarly, when the phase interpolation code PI_CODE corresponds to one of decimal numbers ranging from 32 to 63, the selection signal SEL_IQ[1:0] may be decoded as "10" in binary and the second and third input clock signals CLK90 and CLK180 may be selected to perform the phase interpolation operation in a second quadrant. When the phase interpolation code PI_CODE corresponds to one of decimal numbers ranging from 64 to 95, the selection signal SEL_IQ[1:0] may be decoded as "00" in binary and the third and fourth input clock signals CLK180 and CLK270 may be selected to perform the phase interpolation operation in a third quadrant. When the phase interpolation code PI_CODE corresponds to one of decimal numbers ranging from 96 to 127, the selection signal SEL_IQ[1:0] may be decoded as "01" in binary and the fourth and first input clock signals CLK270 and CLK0 may be selected to perform the phase interpolation operation in a fourth quadrant.

An example of setting the first thermometer code R[6:0], the second thermometer code C[2:0] and the selection signal SEL_IQ[1:0] depending on a change in the phase interpolation code PI_CODE will be described with reference to FIGS. 11 and 12.

Figure 4:
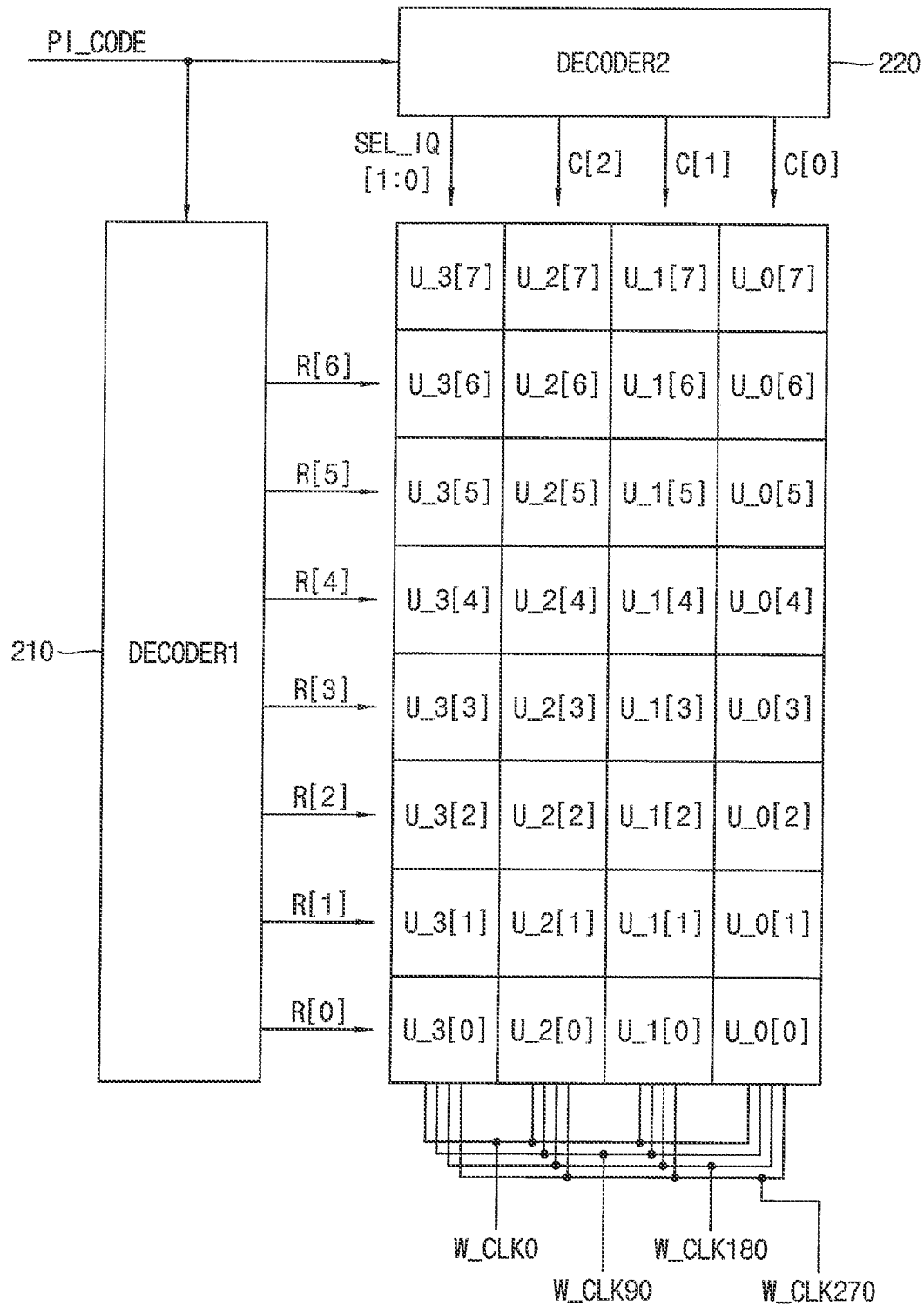
FIG. 4 is block diagram illustrating an example of a decoder and a digital-to-analog converter included in a phase interpolator of FIG. 2.

FIG. 4 is block diagram illustrating an example of a decoder and a digital-to-analog converter included in a phase interpolator of FIG. 2.

Referring to FIGS. 2 and 4, the decoder 200a may include a first decoder 210 and a second decoder 220.

The first decoder 210 may generate seven row bits R[0], R[1], R[2], R[3], R[4], R[5] and R[6] that are included in the first thermometer code R[6:0] based on the phase interpolation code PI_CODE. For example, the row bit R[0] may be a least significant bit (LSB) of the first thermometer code R[6:0] and the row bit R[6] may be a most significant bit (MSB) of the first thermometer code R[6:0]. The first decoder 210 may be referred to as a row decoder.

The second decoder 220 may generate three column bits C[0], C[1] and C[2] that are included in the second thermometer code C[2:0] based on the phase interpolation code PI_CODE and may generate the selection signal SEL_IQ [1:0] based on the phase interpolation code PI_CODE. For example, the column bit (C[0]) may be an LSB of the second thermometer code C[2:0] and the column bit C[2] may be an MSB of the second thermometer code C[2:0]. As will be described with reference to FIG. 5, the selection signal SEL_IQ[1:0] may include a first selection bit SEL _IQ[0] and a second selection bit SEL_IQ[1], the first selection bit SEL_IQ[0] may be an LSB of the selection signal SEL_IQ [1:0], and the second selection bit SEL_IQ[1] may be an MSB of the selection signal SEL_IQ[1:0]. The second decoder 210 may be referred to as a column decoder.

In some example embodiments, each of the first decoder 210 and the second decoder 220 may include a binary-to-thermometer decoder.

The digital-to-analog converter 300a may be implemented in the form of a current cell array that includes a plurality of unit cells U_0[0], U_1[0], U_2[0], U_3[0], UAW, U_1[1], U_2[1], U_3[1], U_0[2], U_1[2], U_2[2], U_3[2], U_0[3], U_1[3], U_2[3], U_3[3], U_0[4], U_1[4], U_2[4], U_3[4], U_0[5], U_1[5], U_2[5], U_3[5], U_0[6], U_1[6], U_2[6], U_3[6], U_0[7], U_1[7], U_2[7] and U_3 [7]. For example, a position of the unit cell U_0[0] that is located at the lowermost and rightmost part of the current cell array may be defined as a first row and a first column, and a position of the unit cell U_3[7] that is located at the uppermost and leftmost part of the current cell array may be defined as an eighth row and a fourth column. In this example, a position of an arbitrary unit cell U_m[n] may be represented by an (n+1)-th row and an (m+1)-th column, where m is an integer greater than or equal to zero and less than or equal to three, and n is an integer greater than or equal to zero and less than or equal to seven.

The unit cells U_0[0], U_1[0], U_2[0], U_3[0], U_0[1], U_1[1], U_2[1], U_3[1], U_0[2], U_1[2], U_2[2], U_3[2], U_0[3], U_1[3], U_2[3], U_3[3], U_0[4], U_1[4], U_2[4], U_3[4], U_0[5], U_1[5], U_2[5], U_3[5], U_0[6], U_1[6], U_2[6], U_3[6], U_0[7], U_1[7] and U_2[7] may correspond to the first unit cell 310a in FIG. 2 and may operate based on all of the first thermometer code R[6:0], the second thermometer code C[2:0] and the selection signal SEL_IQ [1:0]. For example, each of the unit cells U_0[0] to U_3[0], U_0[1] to U_3[1], U_0[2] to U_3[2], U_0[3] to U_3[3], U_0[4] to U_3[4], U_0[5] to U_3[5], U_0[6] to U_3[6], and U_0[7] to U_2[7] may operate based on two row bits, one column bit and two selection bits SEL _IQ[0] and SEL_IQ[1]. For example, depending on a position of each unit cell, the row bits may be replaced with a power supply voltage or a ground voltage, or the column bit may be replaced with an inversion column bit or the ground voltage.

The unit cell U_3[7] may correspond to the second unit cell 350a in FIG. 2, and may operate based on only the selection signals SEL_IQ[1:0]. For example, the unit cell U_3[7] may operate based on only the two selection bits SEL_IQ[0] and SEL3Q[1]. For example, the unit cell U_3 [7] may be added to continuously rotate the phase at the moment when the quadrant is changed (e.g., to switch the direction of the current only when the quadrant is changed) in a process of performing the phase interpolation operation illustrated in FIG. 3.

All of the plurality of unit cells U_0[0] to U_3[0], U_0[1] to U_3[1], U_0[2] to U_3[2], U_0[3] to U_3[3], U_0[4] to U_3[4], U_0[5] to U_3[5], U_0[6] to U_3[6], and U_0[7] to U_3[7] may be commonly connected to a first node (e.g., a first node N11 in FIGS. 6 and 8) outputting the first weight signal W_CLK0, a second node (e.g., a second node N12 in FIGS. 6 and 8) outputting a second weight signal W_CLK90, a third node (e.g., a third node N13 in FIGS. 6 and 8) outputting the third weight signal W_CLK180, and a fourth node (e.g., a fourth node N14 in FIGS. 6 and 8) outputting the fourth weight signal W_CLK270.

As described with reference to FIG. 1, all of the plurality of unit cells U_0[0] to U_3[0], UAW to U_3[1], U_0[2] to U_3[2], U_0[3] to U_3[3], U_0[4] to U_3[4], U_0[5] to U_3[5], U_0[6] to U_3[6], and U_0[7] to U_3[7] may always be turned on and thus the sum of currents flowing through the first through fourth nodes may always be constant. The number of unit cells assigned to each of the selected two weight signals may be changed based on the first thermometer code R[6:0], the second thermometer code C[2:0] and the selection signal SEL_IQ[1:0], the amount of current of the selected two weight signals may be adjusted based on the number of unit cells assigned to the selected two weight signals, and thus the phase interpolation operation illustrated in FIG. 3 may be performed.

Figure 5:
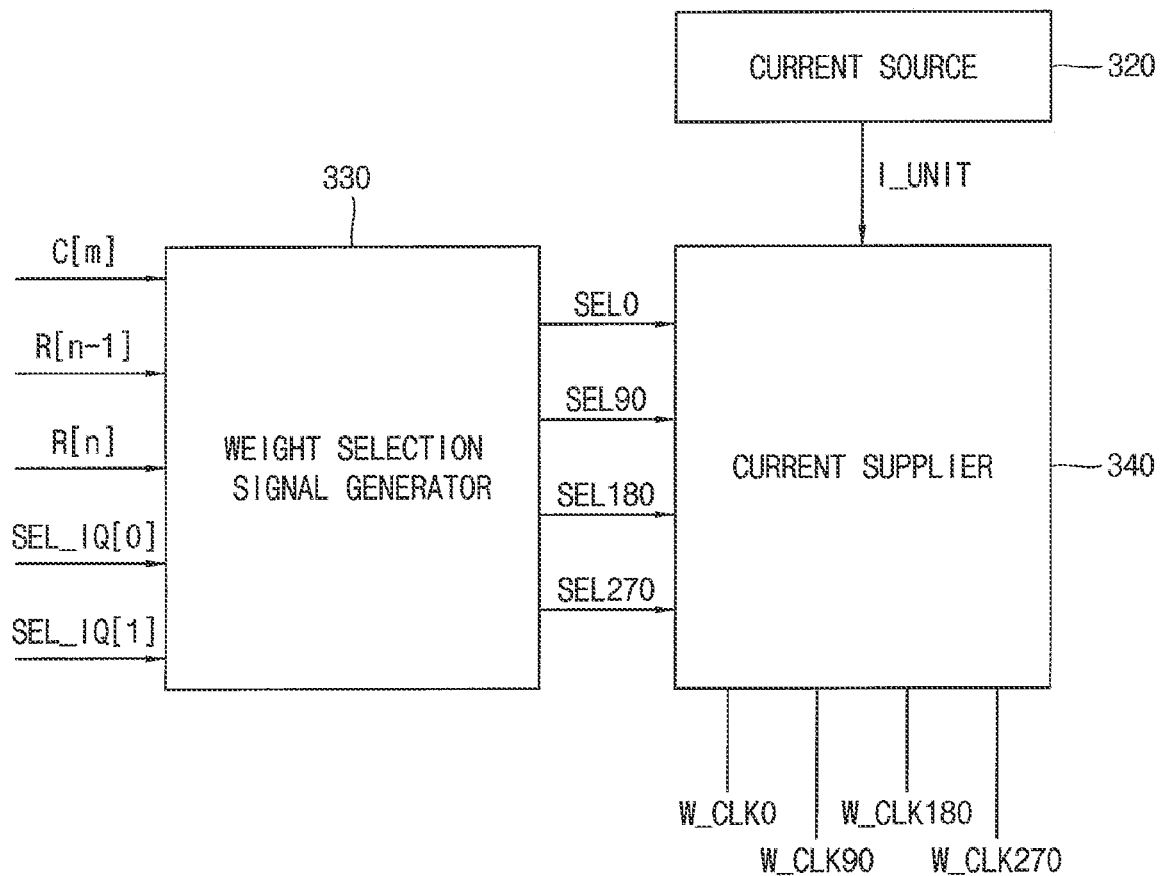
FIG. 5 is a block diagram illustrating an example of a first unit cell included in a digital-to-analog converter of FIG. 4.

FIG. 5 is a block diagram illustrating an example of a first unit cell included in a digital-to-analog converter of FIG. 4.

Referring to FIG. 5, the first unit cell 310a may include a current source 320, a weight selection signal generator 330, and a current supplier 340. The first unit cell 310a of FIG. 5 may be the unit cell U_m[n] that is located in the (n+1)-th row and the (m+1)-th column among the plurality of unit cells U_0[0] to U_3[0], U_0[1] to U_3[1], U_0[2] to U_3 [2], U_0[3] to U_3[3], U_0[4] to U_3[4], U_0[5] to U_3[5], U_0[6] to U_3[6], and U_0[7] to U_3[7] in FIG. 4.

The current source 320 may generate a unit current I_UNIT. As described above, the first unit cell 310a may always be turned on and thus the current source 320 may always be turned on.

The weight selection signal generator 330 may generate a first weight selection signal SEL0, a second weight selection signal SEL90, a third weight selection signal SEL180, and a fourth weight selection signal SEL270 based on a first row bit R[n−1], a second row bit R[n], a first column bit C[m], the first selection bit SEL_IQ[0], and the second selection bit SEL_IQ[1]. The first, second, third, and fourth weight selection signals SEL0, SEL90, SEL180 and SEL270 may correspond to the first, second, third, and fourth weight signals W_CLK0, W_CLK90, W_CLK180 and W_CLK270, respectively.

The current supplier 340 may provide an output (e.g., the unit current I_UNIT) of the current source 320 to one of the first, second, third and fourth weight signals W_CLK0, W_CLK90, W_CLK180 and W_CLK270 based on the first, second, third and fourth weight selection signals SEL0, SEL90, SEL180 and SEL270. In other words, the first unit cell 310a may be assigned to one of the first, second, third, and fourth weight signals W_CLK0, W_CLK90, W_CLK180 and W_CLK270 based on the first, second, third, and fourth weight selection signals SEL0, SEL90, SEL180 and SEL270.

Figure 6:
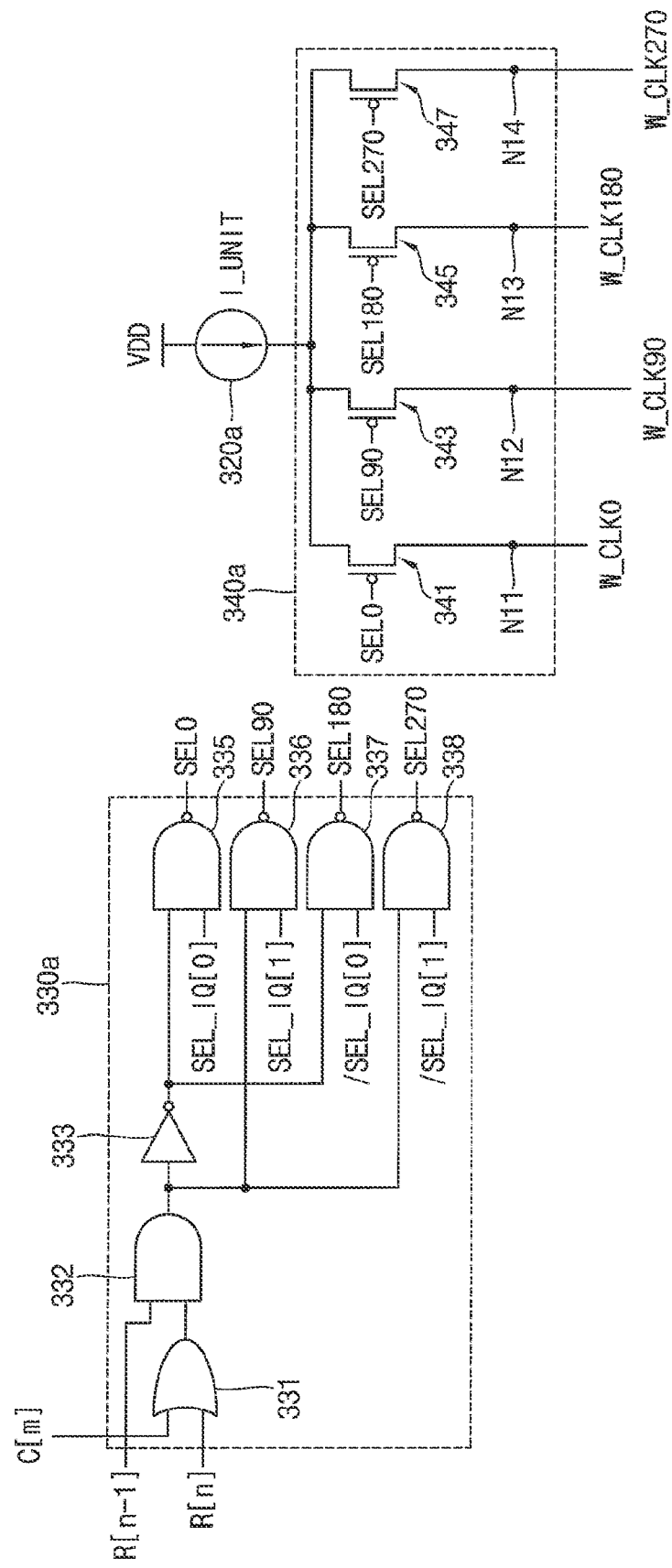
FIG. 6 is a circuit diagram illustrating an example of a first unit cell of FIG. 5.

FIG. 6 is a circuit diagram illustrating an example of a first unit cell of FIG. 5.

Referring to FIG. 6, a current source 320a may correspond to the current source 320 in FIG. 5, may be connected to a power supply voltage VDD, and may generate the unit current I_UNIT.

The weight selection signal generator 330a may include an OR gate 331, an AND gate 332, an inverter 333 and NAND gates 335, 336, 337 and 338.

The OR gate 331 may perform an OR operation on the first column bit C[m] and the second row bit R[n]. The AND gate 332 may perform an AND operation on the first row bit R[n−1] and an output of the OR gate 331. The inverter 333 may invert an output of the AND gate 332. The NAND gate 335 may generate the first weight selection signal SEL0 by performing a NAND operation on an output of the inverter 333 and the first selection bit SEL_IQ[0]. The NAND gate 336 may generate the second weight selection signal SEL90 by performing the NAND operation on the output of the AND gate 332 and the second selection bit SEL_IA[1]. The NAND gate 337 may generate the third weight selection signal SEL180 by performing the NAND operation on the output of the inverter 333 and a first inversion selection bit/SEL_IQ[0] in which the first selection bit SEL_IQ[0] is inverted. The NAND gate 338 may generate the fourth weight selection signal SEL270 by performing the NAND operation on the output of the AND gate 332 and a second inversion selection bit/SEL_IQ[1] in which the second selection bit SEL_IQ[1] is inverted.

The current supplier 340a may include transistors 341, 343, 345 and 347.

The transistor 341 may be connected between the current source 320a and the first node N11 outputting the first weight signal W_CLK0 and may have a gate electrode receiving the first weight selection signal SEL0. The transistor 343 may be connected between the current source 320a and the second node N12 outputting the second weight signal W_CLK90 and may have a gate electrode receiving the second weight selection signal SEL90. The transistor 345 may be connected between the current source 320a and the third node N13 outputting the third weight signal W_CLK180 and may have a gate electrode receiving the third weight selection signal SEL180. The transistor 347 may be connected between the current source 320a and the fourth node N14 outputting the fourth weight signal W_CLK270 and may have a gate electrode receiving the fourth weight selection signal SEL270.

In some example embodiments, only one of the first, second, third and fourth weight selection signals SEL0, SEL90, SEL180 and SEL270 may be activated. For example, when the first weight selection signal SEL0 is activated, the unit current I_UNIT may be provided to the first node N11. Alternatively, when the second weight selection signal SEL90, the third weight selection signal SEL180 or the fourth weight selection signal SEL270 is activated, the unit current I_UNIT may be provided to the second node N12, the third node N13 or the fourth node N14, respectively.

In some example embodiments, the transistors 341, 343, 345 and 347 may be p-type metal oxide semiconductor (PMOS) transistors, however, example embodiments are not limited thereto.

Figure 7:
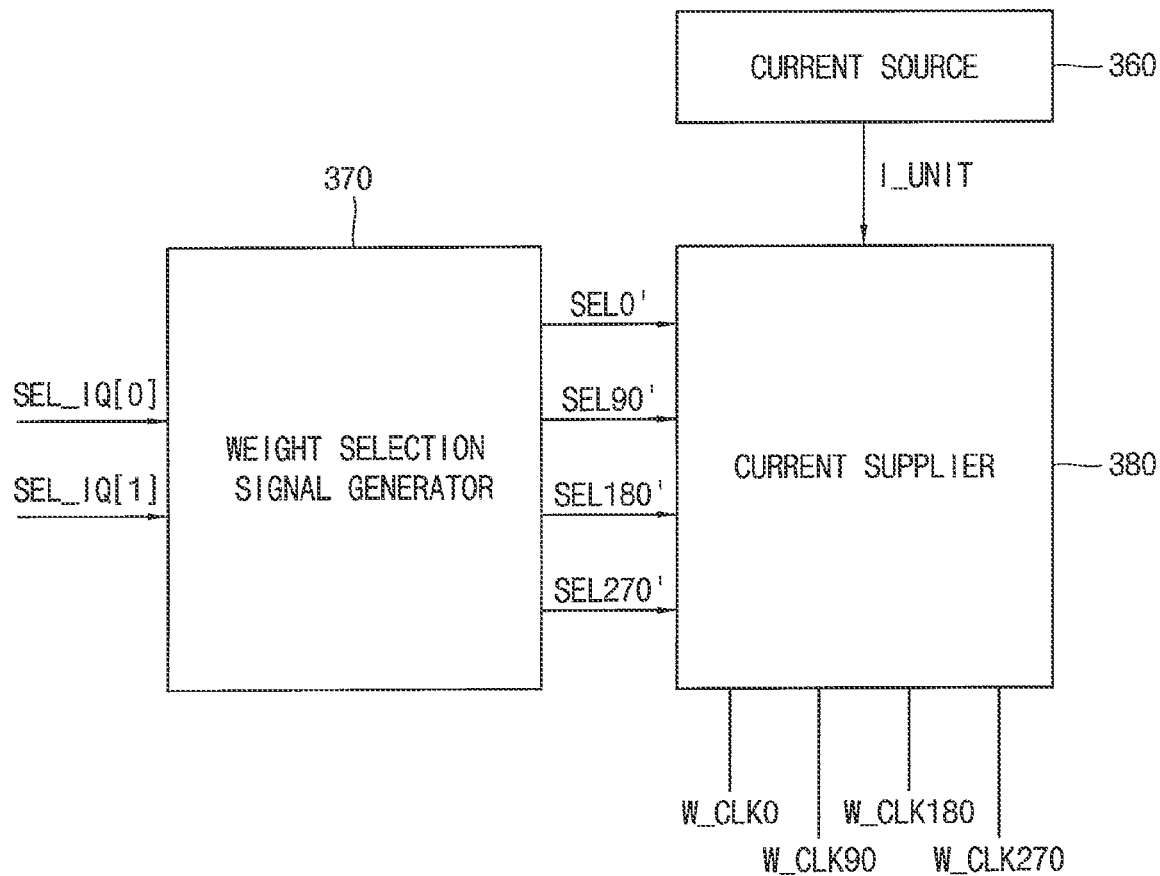
FIG. 7 is a block diagram illustrating an example of a second unit cell included in a digital-to-analog converter of FIG. 4.

FIG. 7 is a block diagram illustrating an example of a second unit cell included in a digital-to-analog converter of FIG. 4. The descriptions repeated with FIG. 5 will be omitted.

Referring to FIG. 7, the second unit cell 350a may include a current source 360, a weight selection signal generator 370 and a current supplier 380. The second unit cell 350a of FIG. 7 may be the unit cell U_3[7] that is located in the eighth row and the fourth column in FIG. 4.

The current source 360 may generate a unit current I_UNIT. The amount of the unit current I_UNIT generated from the current source 360 may be substantially equal to the amount of the unit current I_UNIT generated from the current source 320 in FIG. 5.

The weight selection signal generator 370 may generate a first weight selection signal SEL0', a second weight selection signal SEL90', a third weight selection signal SEL180', and a fourth weight selection signal SEL270' based on the first selection bit SEL_IQ[0] and the second selection bit SEL_IQ[1]. The first, second, third and fourth weight selection signals SEL0', SEL90', SEL180', and SEL270' may correspond to the first, second, third, and fourth weight signals W_CLK0, W_CLK90, W_CLK180 and W_CLK270, respectively.

The current supplier 380 may provide an output (e.g., the unit current I_UNIT) of the current source 360 to one of the first, second, third, and fourth weight signals W_CLK0, W_CLK90, W_CLK180, and W_CLK270 based on the first, second, third and fourth weight selection signals SEL0', SEL90', SEL180', and SEL270'.

Figure 8:
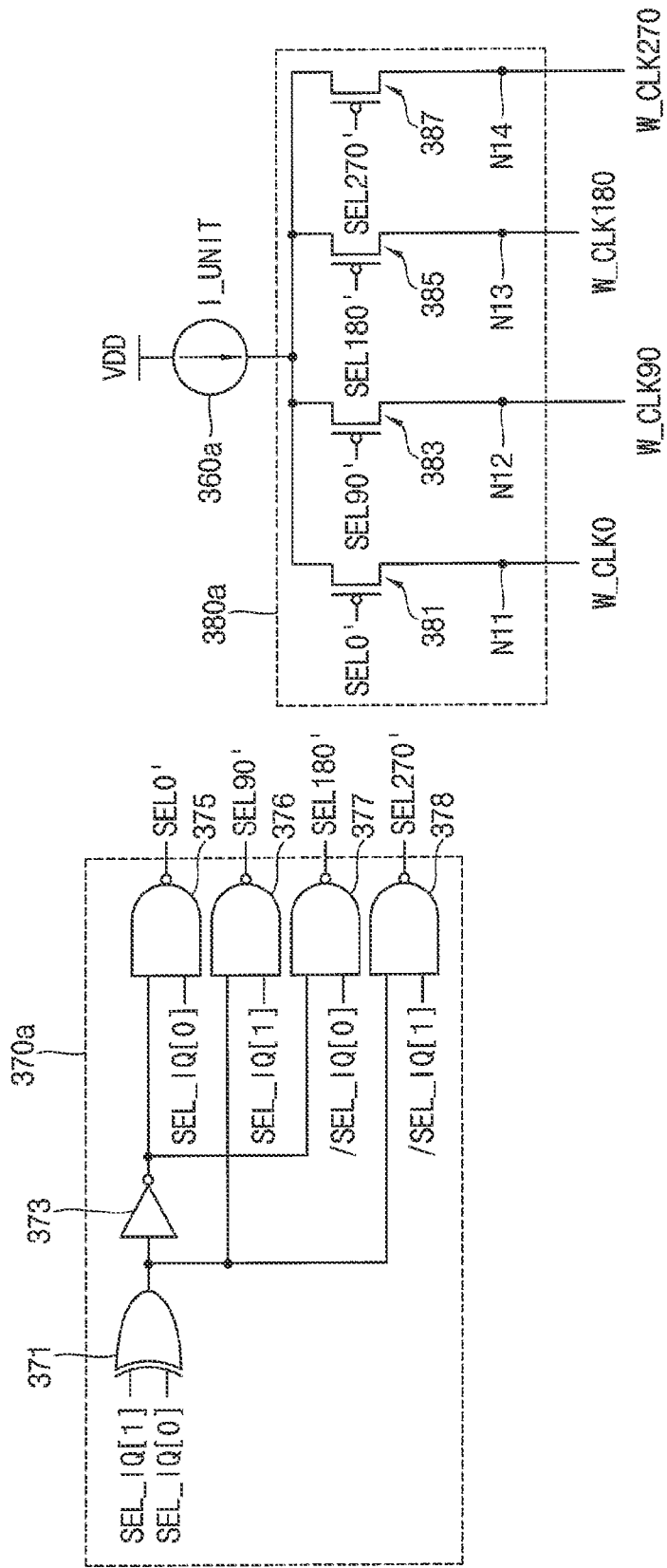
FIG. 8 is a circuit diagram illustrating an example of a second unit cell of FIG. 7.

FIG. 8 is a circuit diagram illustrating an example of a second unit cell of FIG. 7. The descriptions repeated with FIG. 6 will be omitted.

Referring to FIG. 8, a current source 360a may correspond to the current source 360 in FIG. 7, may be connected to the power supply voltage VDD, and may generate the unit current I_UNIT.

The weight selection signal generator 370a may include an XOR gate 371, an inverter 373, and NAND gates 375, 376, 377, and 378.

The XOR gate 371 may perform an XOR operation on the first selection bit SEL_IQ[0] and the second selection bit SEL_IQ[1]. The inverter 373 may invert an output of the XOR gate 371. The NAND gate 375 may generate the first weight selection signal SEL0' by performing the NAND operation on an output of the inverter 373 and the first selection bit SEL_IQ[0]. The NAND gate 376 may generate the second weight selection signal SEL90' by performing the NAND operation on the output of the XOR gate 371 and the second selection bit SEL_IQ[1]. The NAND gate 377 may generate the third weight selection signal SEL180' by performing the NAND operation on the output of the inverter 373 and the first inversion selection bit/SEL_IQ[0]. The NAND gate 378 may generate the fourth weight selection signal SEL270' by performing the NAND operation on the output of the XOR gate 371 and the second inversion selection bit/SEL_IQ[1].

The current supplier 380a may include transistors 381, 383, 385 and 387.

The transistor 381 may be connected between the current source 360a and the first node N11 outputting the first weight signal W_CLK0 and may have a gate electrode receiving the first weight selection signal SEL0'. The transistor 383 may be connected between the current source 360a and the second node N12 outputting the second weight signal W_CLK90 and may have a gate electrode receiving the second weight selection signal SEL90'. The transistor 385 may be connected between the current source 360a and the third node N13 outputting the third weight signal W_CLK180 and may have a gate electrode receiving the third weight selection signal SEL180'. The transistor 387 may be connected between the current source 360a and the fourth node N14 outputting the fourth weight signal W_CLK270 and may have a gate electrode receiving the fourth weight selection signal SEL270'.

Figure 9:
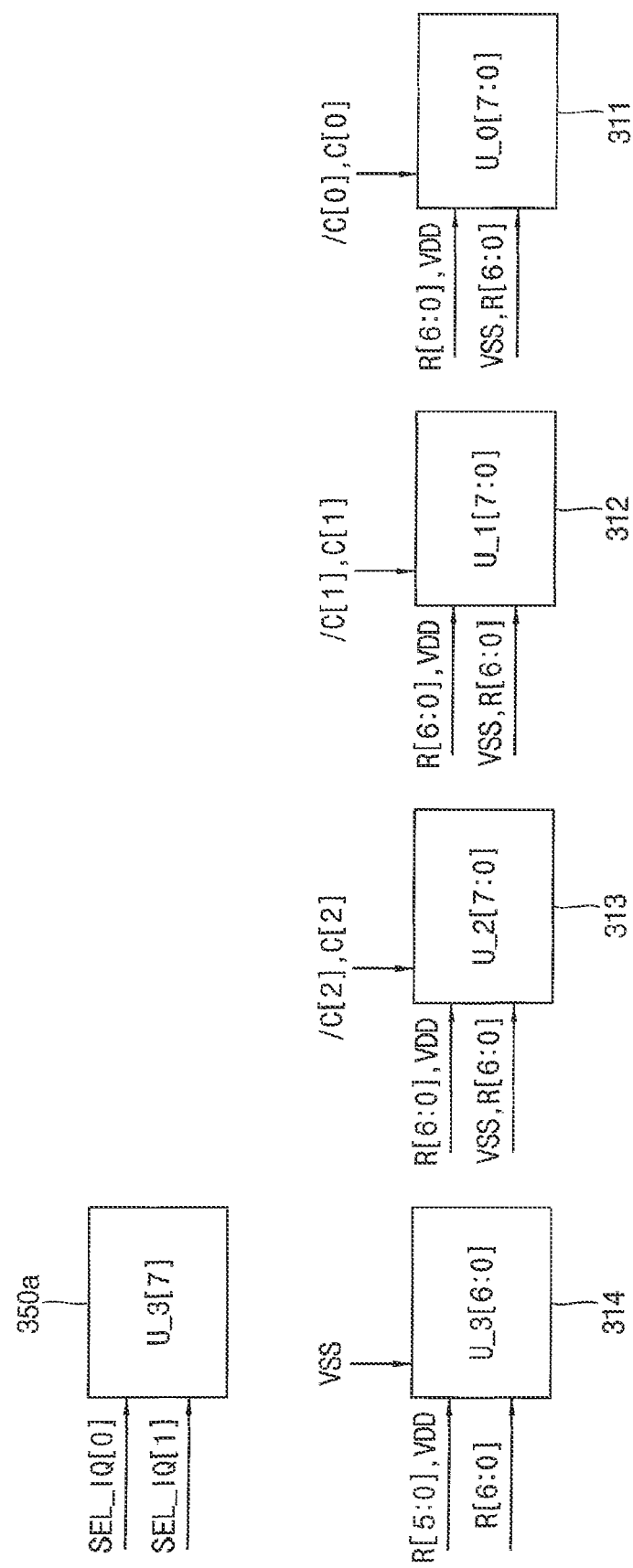
FIG. 9 is a block diagram for describing first and second unit cells included in a digital-to-analog converter of FIG. 4.

FIG. 9 is a block diagram for describing first and second unit cells included in a digital-to-analog converter of FIG. 4. The descriptions repeated with FIGS. 5, 6, 7 and 8 will be omitted.

Referring to FIG. 9, first unit cells (U_0[7:0]) 311 may be the first unit cells (e.g., the first unit cells U_0[0] to U_0[7])

that are located in the first column of the digital-to-analog converter 300a of FIG. 4. First unit cells (U_1[7:0]) 312 may be the first unit cells (e.g., the first unit cells U_1[0] to U_1[7]) that are located in the second column of the digital-to-analog converter 300a of FIG. 4. First unit cells (U_2[7:0]) 313 may be the first unit cells (e.g., the first unit cells U_2[0] to U_2[7]) that are located in the third column of the digital-to-analog converter 300a of FIG. 4. First unit cells (U_3[6:0]) 314 may be the first unit cells (e.g., the first unit cells U_3[0] to U_3[6]) that are located in the fourth column of the digital-to-analog converter 300a of FIG. 4. The second unit cell 350a may be the second unit cell U_3[7] that is located in the eighth row and the fourth column of the digital-to-analog converter 300a of FIG. 4.

In some example embodiments, depending on an arrangement of the first unit cells 311, 312, 313 and 314 in the digital-to-analog converter 300a, the first row bit R[n−1] may be replaced with the power supply voltage VDD, the second row bit R[n] may be replaced with a ground voltage VSS, or the first column bit C[m] may be replaced with the ground voltage VSS or a first inversion column bit/C[m] in which the first column bit C[m] is inverted.

For example, the digital-to-analog converter 300a may include an inverter that generates the first inversion column bit/C[m].

For example, in the first unit cells 311, a bit R[4] corresponding to the first row bit R[n−1] input to the unit cell U_0[0] that is located in the first row and the first column may not exist and thus the first row bit R[n−1] input to the unit cell U_0[0] may be replaced with the power supply voltage VDD. In addition, in the first unit cells 311, a bit R[7] corresponding to the second row bit R[n] input to the unit cell U_0[7] that is located in the eighth row and the first column may not exist and thus the second row bit R[n] input to the unit cell U_0[7] may be replaced with the ground voltage VSS. Further, in the first unit cells 311, the bit C[0] may be input as the first column bit C[m] to the unit cells U_0[0], U_0[2], U_0[4] and U_0[6] that are located in odd-numbered rows, and an inversion bit/C[0] in which the bit C[0] is inverted may be input as the first column bit C[m] to the unit cells U_0[1], U_0[3], U_0[5] and U_0[7] that are located in even-numbered rows.

As a result, in the first unit cells 311, the first row bit R[n−1], the second row bit R[n] and the first column bit C[m] that are input to the unit cell U_0[0] may be the power supply voltage VDD, the bit R[0] and the bit C[0], respectively. The first row bit R[n−1], the second row bit R[n] and the first column bit C[m] that are input to the unit cell U_0[1] may be the bits R[0], R[1] and/C[0], respectively. Similarly, the bits R[1], R[2] and C[0] may be input to the unit cell U_0[2]. The bits R[2], R[3] and/C[0] may be input to the unit cell U_0[3]. The bits R[3], R[4] and C[0] may be input to the unit cell U_0[4]. The bits R[4], R[5] and/C[0] may be input to the unit cell U_0[5]. The bits R[5], R[6] and C[0] may be input to the unit cell U_0[6]. The bit R[6], the ground voltage VSS and the bit/C[0] may be input to the unit cell U_0[7].

As with the first unit cells 311, in the first unit cells 312, the power supply voltage VDD, the bit R[0] and the bit C[1] may be input to the unit cell U_1[0]. The bits R[0], R[1] and/C[1] may be input to the unit cell U_1[1]. The bits R[1], R[2] and C[1] may be input to the unit cell U_1[2]. The bits R[2], R[3] and/C[1] may be input to the unit cell U_1[3]. The bits R[3], R[4] and C[1] may be input to the unit cell U_1[4]. The bits R[4], R[5] and/C[1] may be input to the unit cell U_1[5]. The bits R[5], R[6] and C[1] may be input to the unit cell U_1[6]. The bit R[6], the ground voltage VSS and the bit/C[1] may be input to the unit cell U_1[7].

As with the first unit cells 311 and 312, in the first unit cells 313, the power supply voltage VDD, the bit R[0] and the bit C[2] may be input to the unit cell U_2[0]. The bits R[0], R[1] and/C[2] may be input to the unit cell U_2[1]. The bits R[1], R[2] and C[2] may be input to the unit cell U_2[2]. The bits R[2], R[3] and/C[2] may be input to the unit cell U_2[3]. The bits R[3], R[4] and C[2] may be input to the unit cell U_2[4]. The bits R[4], R[5] and/C[2] may be input to the unit cell U_2[5]. The bits R[5], R[6] and C[2] may be input to the unit cell U_2[6]. The bit R[6], the ground voltage VSS and the bit/C[2] may be input to the unit cell U_2[7].

A bit C[3] corresponding to the first column bit C[m] input to the first unit cells 314 that are located in the fourth column may not exist, and thus the first column bit C[m] input to the first unit cells 314 may be replaced with the ground voltage VSS. Thus, in the first unit cells 314, the power supply voltage VDD, the bit R[0] and the ground voltage VSS may be input to the unit cell U_3[0]. The bit R[0], the bit R[1] and the ground voltage VSS may be input to the unit cell U_3[1]. The bit R[1], the bit R[2] and the ground voltage VSS may be input to the unit cell U_3[2]. The bit R[2], the bit R[3] and the ground voltage VSS may be input to the unit cell U_3[3]. The bit R[3], the bit R[4] and the ground voltage VSS may be input to the unit cell U_3[4]. The bit R[4], the bit R[5] and the ground voltage VSS may be input to the unit cell U_3[5]. The bit R[5], the bit R[6] and the ground voltage VSS may be input to the unit cell U_3[6].

When the bits and voltages are applied to the plurality of unit cells 311, 312, 313, 314 and 350a as described above, the digital-to-analog converter 300a may operate as follows.

First, an example where the phase interpolation operation is performed in the first quadrant will be described. When the phase interpolation code PI_CODE corresponds to zero in decimal, all unit cells may be assigned to the first weight signal W_CLK0 and the first input clock signal CLK0. Whenever the phase interpolation code PI_CODE increases by one, the number of unit cells assigned to the second weight signal W_CLK90 and the second input clock signal CLK90 may increase by one, and the number of unit cells assigned to the first weight signal W_CLK0 and the first input clock signal CLK0 may decrease by one.

For example, an order in which the unit cells are assigned to the second weight signal W_CLK90 and the second input clock signal CLK90 may be as follows: (1) the unit cell U_0[0], (2) the unit cell U_1[0], (3) the unit cell U_2[0], (4) the unit cell U_3[0], (5) the unit cell U_2[1], (6) the unit cell U_1[1], (7) the unit cell U_0[1], (8) the unit cell U_3[1], (9) the unit cell U_0[2], (10) the unit cell U_1[2], (11) the unit cell U_2[2], (12) the unit cell U_3[2], (13) the unit cell U_2[3], (14) the unit cell U_1[3], (15) the unit cell U_0[3], (16) the unit cell U_3[3], (17) the unit cell U_0[4], (18) the unit cell U_1[4], (19) the unit cell U_2[4], (20) the unit cell U_3[4], (21) the unit cell U_2[5], (22) the unit cell U_1[5], (23) the unit cell U_0[5], (24) the unit cell U_3[5], (25) the unit cell U_0 [6], (26) the unit cell U_1[6], (27) the unit cell U_2[6], (28) the unit cell U_3[6], (29) the unit cell U_2[7], (30) the unit cell U_1[7], (31) the unit cell U_0[7], and (32) the unit cell U_3[7].

In this example, in the first, second and third columns, the unit cells may be sequentially added to the second weight signal W_CLK90 in an order of the first column, the second column and the third column in the first row, and the unit cells may be sequentially added to the second weight signal W_CLK90 in an order of the third column, the second column and the first column in the second row. In addition, the unit cells may be sequentially added to the second weight signal W_CLK90 in the order of the first column, the second column and the third column again in the third row, and the unit cells may be sequentially added to the second weight signal W_CLK90 in the order of the third column, the second column and the first column again in the fourth row. In other words, the unit cells in the first, second and third columns may be added to the second weight signal W_CLK90 in a zigzag scheme or manner.

After that, an example where the phase interpolation operation is performed in the second quadrant will be described. When the phase interpolation code PI_CODE corresponds to 32 in decimal, all unit cells may be assigned to the second weight signal W_CLK90 and the second input clock signal CLK90. Whenever the phase interpolation code PI_CODE increases by one, the number of unit cells assigned to the third weight signal W_CLK180 and the third input clock signal CLK180 may increase by one and the number of unit cells assigned to the second weight signal W_CLK90 and the second input clock signal CLK90 may decrease by one.

For example, an order in which the unit cells are assigned to the third weight signal W_CLK180 and the third input clock signal CLK180 may be opposite to the order in which the unit cells are assigned to the second weight signal W_CLK90 and the second input clock signal CLK90 in the first quadrant, and may be as follows: (1) the unit cell U_3[7], (2) the unit cell U_0[7], (3) the unit cell U_1[7], (4) the unit cell U_2[7], (5) the unit cell U_3[6], (6) the unit cell U_2[6], (7) the unit cell U_1[6], (8) the unit cell U_0[6], (9) the unit cell U_3[5], (10) the unit cell U_0[5], (11) the unit cell U_1[5], (12) the unit cell U_2[5], (13) the unit cell U_3[4], (14) the unit cell U_2[4], (15) the unit cell U_1[4], (16) the unit cell U_0[4], (17) the unit cell U_3[3], (18) the unit cell U_0[3], (19) the unit cell U_1[3], (20) the unit cell U_2[3], (21) the unit cell U_3[2], (22) the unit cell U_2[2], (23) the unit cell U_1[2], (24) the unit cell U_0[2], (25) the unit cell U_3[1], (26) the unit cell UAW, (27) the unit cell U_1[1], (28) the unit cell (U_2[1], (29) the unit cell U_3[0], (30) the unit cell U_2[0], (31) the unit cell U_1[0], and (32) the unit cell U_0[0].

After that, the phase interpolation operation in the third quadrant may be similar to that in the first quadrant. After that, the phase interpolation operation in the fourth quadrant may be similar to that in the second quadrant.

As described above, only one unit cell may be added to the weight signal whenever the phase interpolation code PI_CODE increases by one and thus the monotonic characteristic may be implemented.

Figure 10:
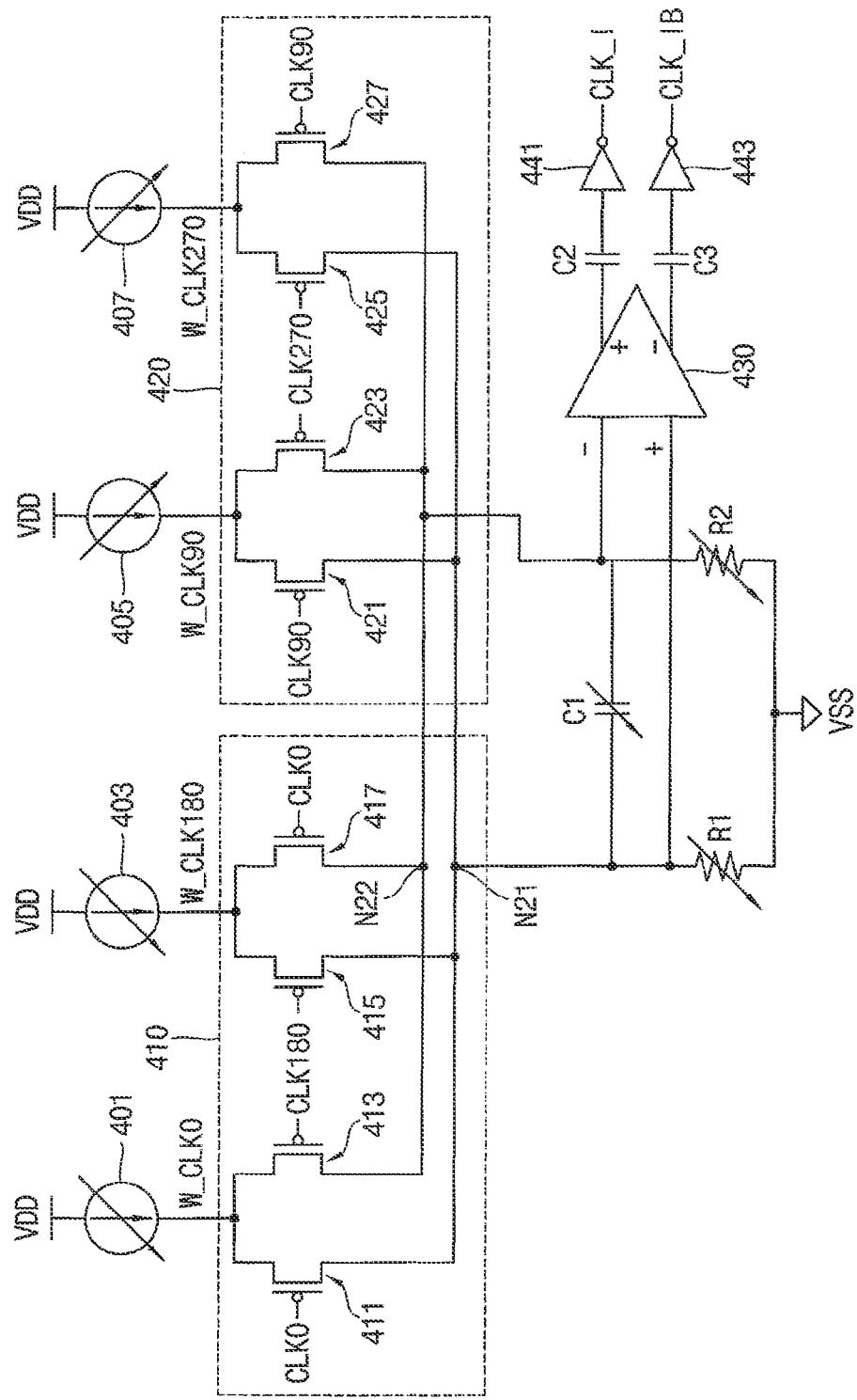
FIG. 10 is a circuit diagram illustrating an example of a phase mixer included in a phase interpolator of FIG. 2.

FIG. 10 is a circuit diagram illustrating an example of a phase mixer included in a phase interpolator of FIG. 2.

Referring to FIGS. 2 and 10, the phase mixer 400a may include a first circuit 410, a second circuit 420 and an amplifier 430. The phase mixer 400a may further include capacitors C1, C2, and C3, resistors R1 and R2, and inverters 441 and 443.

The first circuit 410 may receive the first and third weight signals W_CLK0 and W_CLK180, may operate based on the first and third input clock signals CLK0 and CLK180, and may be connected to a node N21 and a node N22. The first circuit 410 may include transistors 411, 413, 415 and 417.

The transistor 411 may be connected between the first weight signal W_CLK0 and the node N21 and may have a gate electrode receiving the first input clock signal CLK0. The transistor 413 may be connected between the first weight signal W_CLK0 and the node N22 and may have a gate electrode receiving the third input clock signal CLK180. The transistor 415 may be connected between the third weight signal W_CLK180 and the node N21 and may have a gate electrode receiving the third input clock signal CLK180. The transistor 417 may be connected between the third weight signal W_CLK180 and the node N22 and may have a gate electrode receiving the first input clock signal CLK0.

The second circuit 420 may receive the second and fourth weight signals W_CLK90 and W_CLK270, may operate based on the second and fourth input clock signals CLK90 and CLK270 and may be connected to the node N21 and the node N22. The second circuit 420 may include transistors 421, 423, 425 and 427.

The transistor 421 may be connected between the second weight signal W_CLK90 and the node N21 and may have a gate electrode receiving the second input clock signal CLK90. The transistor 423 may be connected between the second weight signal W_CLK90 and the node N22 and may have a gate electrode receiving the fourth input clock signal CLK270. The transistor 425 may be connected between the fourth weighting signal W_CLK270 and the node N21 and may have a gate electrode receiving the fourth input clock signal CLK270. The transistor 427 may be connected between the fourth weighting signal W_CLK270 and the node N22 and may have a gate electrode receiving the second input clock signal CLK90.

In some example embodiments, the transistors 411, 413, 415, 417, 421, 423, 425 and 427 may be PMOS transistors, however, example embodiments are not limited thereto.

Current sources 401, 403, 405 and 407 illustrated in FIG. 10 may not be components that are actually included in the phase mixer 400a, but may conceptually represent that the amount of current of the first, second, third and fourth weight signals W_CLK0, W_CLK90, W_CLK180 and W_CLK270 are changed by the digital-to-analog converter 300a.

The amplifier 430 may be connected to the nodes N21 and N22, and may generate the output clock signal CLK_I and the inversion output clock signal CLK_IB that are a pair of differential signals based on operations of the first and second circuits 410 and 420. For example, the amplifier 430 may be a current mode logic (CML) amplifier.

The capacitor C1 may be connected between the nodes N21 and N22. The resistor R1 may be connected between the node N21 and the ground voltage VSS. The resistor R2 may be connected between the node N22 and the ground voltage VSS. The capacitor C2 and the inverter 441 may be connected in series between an output of the amplifier 430 and an output terminal providing the output clock signal CLK_I. The capacitor C3 and the inverter 443 may be connected in series between the output of the amplifier 430 and an output terminal providing the inversion output clock signal CLK_IB.

FIGS. 11A, 11B, 11C, 11D, 12 and 13 are diagrams for describing an operation of a phase interpolator of FIG. 2.

Figure 12:
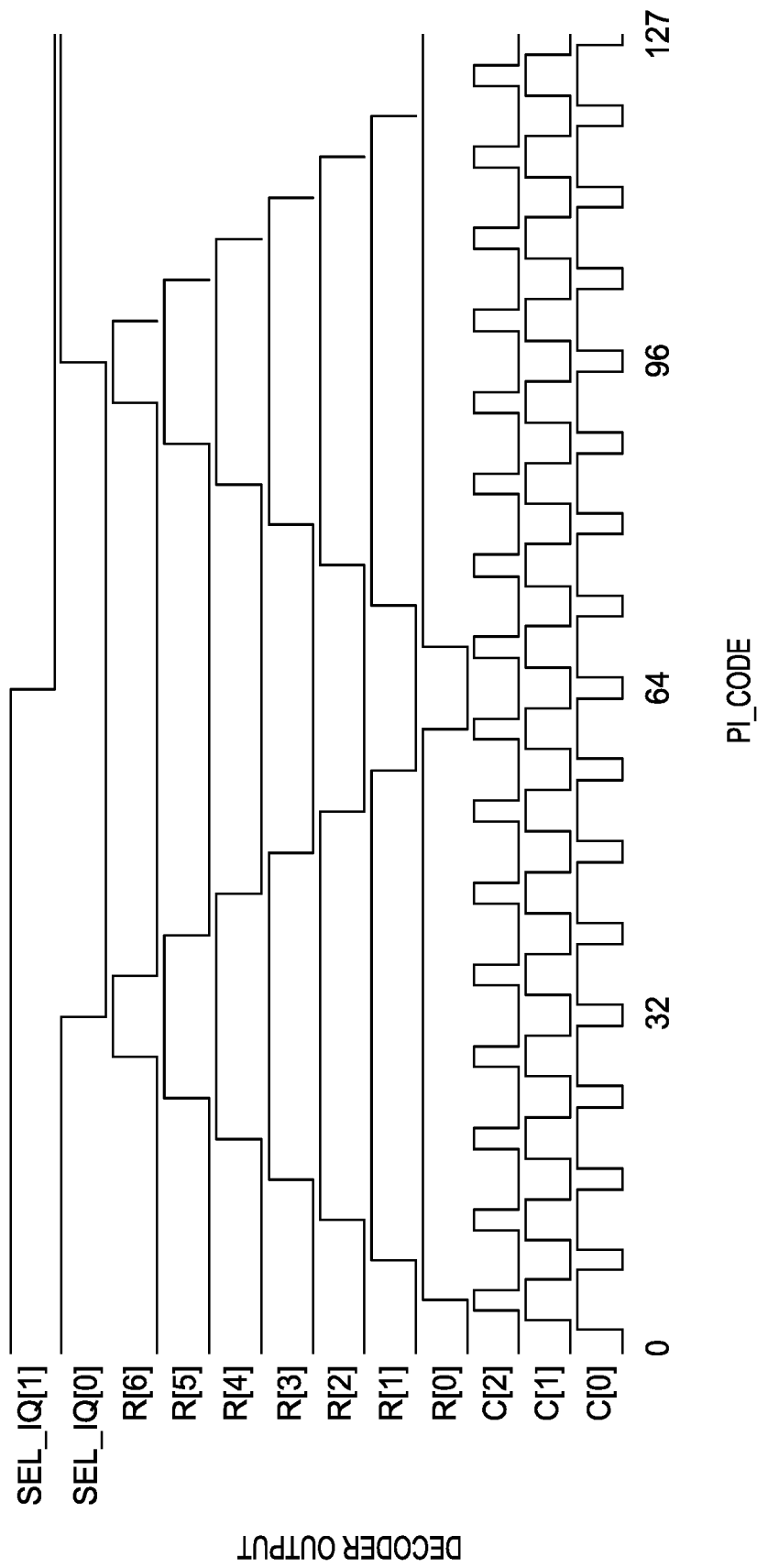

Referring to FIGS. 11A, 11B, 11C, 11D and 12, the phase interpolation code PI_CODE, the first thermometer code R[6:0], the second thermometer code C[2:0] and the selection signal SEL_IQ[1:0] may be implemented as illustrated. In this example, when the phase interpolation code PI_CODE is changed, only one bit of the outputs of the decoder 200a may be toggled as illustrated in FIG. 12 and thus the glitch-free characteristic may be implemented.

Referring to FIG. 13, CASE1 represents a conventional phase interpolator including a digital-to-analog converter that is controlled by a binary code of 5 bits. CASE2 represents a conventional phase interpolator including a digital-to-analog converter that is controlled by a thermometer code of 7 bits and a binary code of 2 bits. CASE3 represents a conventional phase interpolator including a digital-to-analog converter that is controlled by a thermometer code of 31 bits. CASE4 represents the phase interpolator 100a of FIG. 2 according to example embodiments including the digital-to-analog converter 300a that is controlled by the two-dimensional thermometer codes including the first thermometer code R[6:0] of 7 bits and the second thermometer code C[2:0] of 3 bits In the conventional phase interpolators such as CASE1 and CASE2 in which the digital-to-analog converters are controlled based on a binary code, although the number of control bits is reduced, the DNL characteristic may be deteriorated and the monotonic characteristic and the glitch-free characteristic cannot be guaranteed. In the conventional phase interpolator such as CASE2 in which the digital-to-analog converter is controlled based on a one-dimensional thermometer code, the DNL characteristic may be better and the monotonic characteristic and the glitch-free characteristic may be obtained, but the number of control bits may be greatly increased. In the phase interpolator 100a according to example embodiments such as CASE4 in which the digital-to-analog converter is controlled based on the two-dimensional thermometer codes, the performance such as the DNL performance, the monotonic characteristic and the glitch-free characteristic may be improved or enhanced even though a relatively small number of control bits are used.

Although example embodiments are described based on a specific number of signals, bits, unit cells, and a specific code configuration, example embodiments are not limited thereto. For example, the number of signals, bits, unit cells, and a code configuration may be variously changed according to example embodiments.

Figure 14:
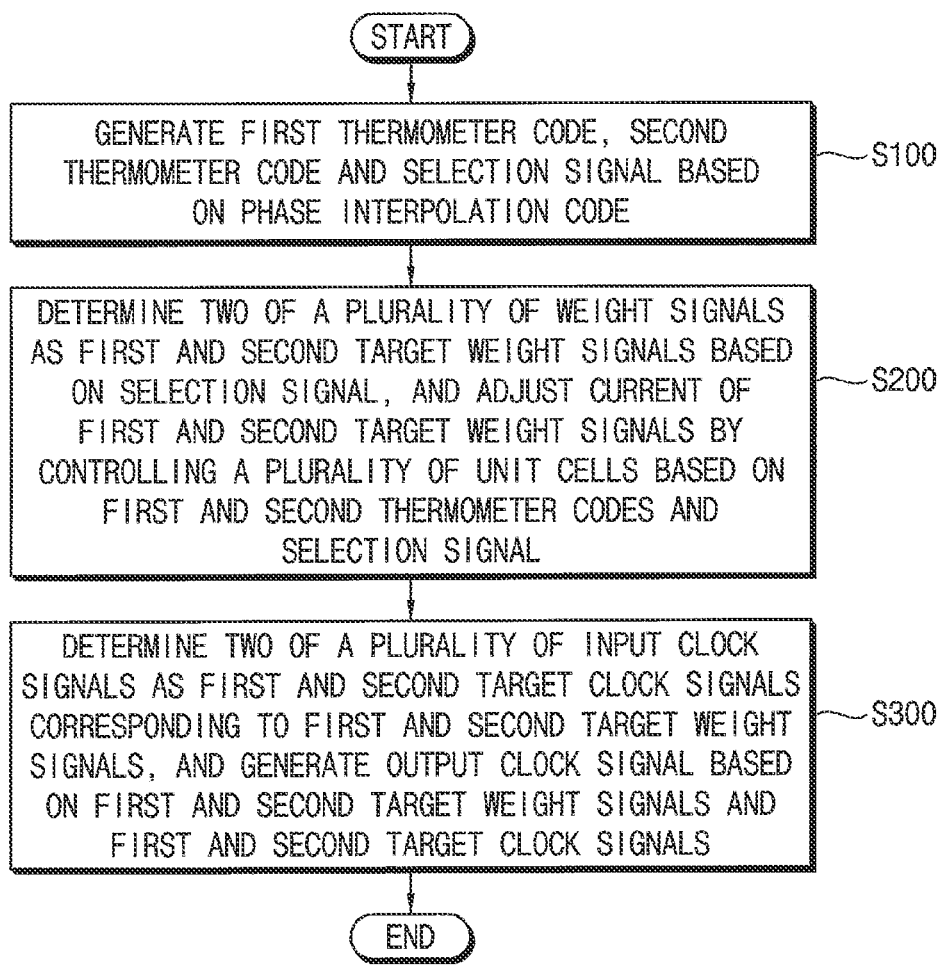
FIG. 14 is a flowchart illustrating a method of generating a phase interpolation clock signal according to example embodiments.

FIG. 14 is a flowchart illustrating a method of generating a phase interpolation clock signal according to example embodiments.

Referring to FIGS. 1 and 14, in a method of generating a phase interpolation clock signal according to example embodiments, the first thermometer code TCODE1, the second thermometer code TCODE2 and the selection signal SEL_IQ are generated based on the phase interpolation code PI_CODE (step S100). For example, step S100 may be performed by the decoder 200 and the phase interpolation code PI_CODE, the first thermometer code TCODE1, the second thermometer code TCODE2 and the selection signal SEL_IQ may be implemented as described with reference to FIGS. 3, 11 and 12.

Two of the plurality of weight signals W_CLK are determined as the first and second target weight signals based on the selection signal SEL_IQ, and the amount of current of the first and second target weight signals are adjusted by controlling the plurality of unit cells 310 and 350 based on the first and second thermometer codes TCODE1 and TCODE2 and the selection signal SEL_IQ (step S200). For example, step S200 may be performed by the digital-to-analog converter 300, the plurality of unit cells 310 and 350 may include the first unit cell 310 and the second unit cell 350 that are different types, and the first and second unit cells 310 and 350 may be implemented as described with reference to FIGS. 1, 5, 6, 7, 8 and 9.

Two of the plurality of input clock signals CLK are determined as the first and second target clock signals corresponding to the first and second target weight signals, and the output clock signal OCLK is generated based on the first and second target weight signals and the first and second target clock signals (e.g., by performing the phase interpolation operation on the first and second target clock signals based on the first and second target weight signals) (step S300). For example, step S300 may be performed by the phase mixer 400, and the output clock signal OCLK may be generated to have the glitch-free characteristic and the monotonic characteristic.

As will be appreciated by those skilled in the art, the disclosure may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 15:
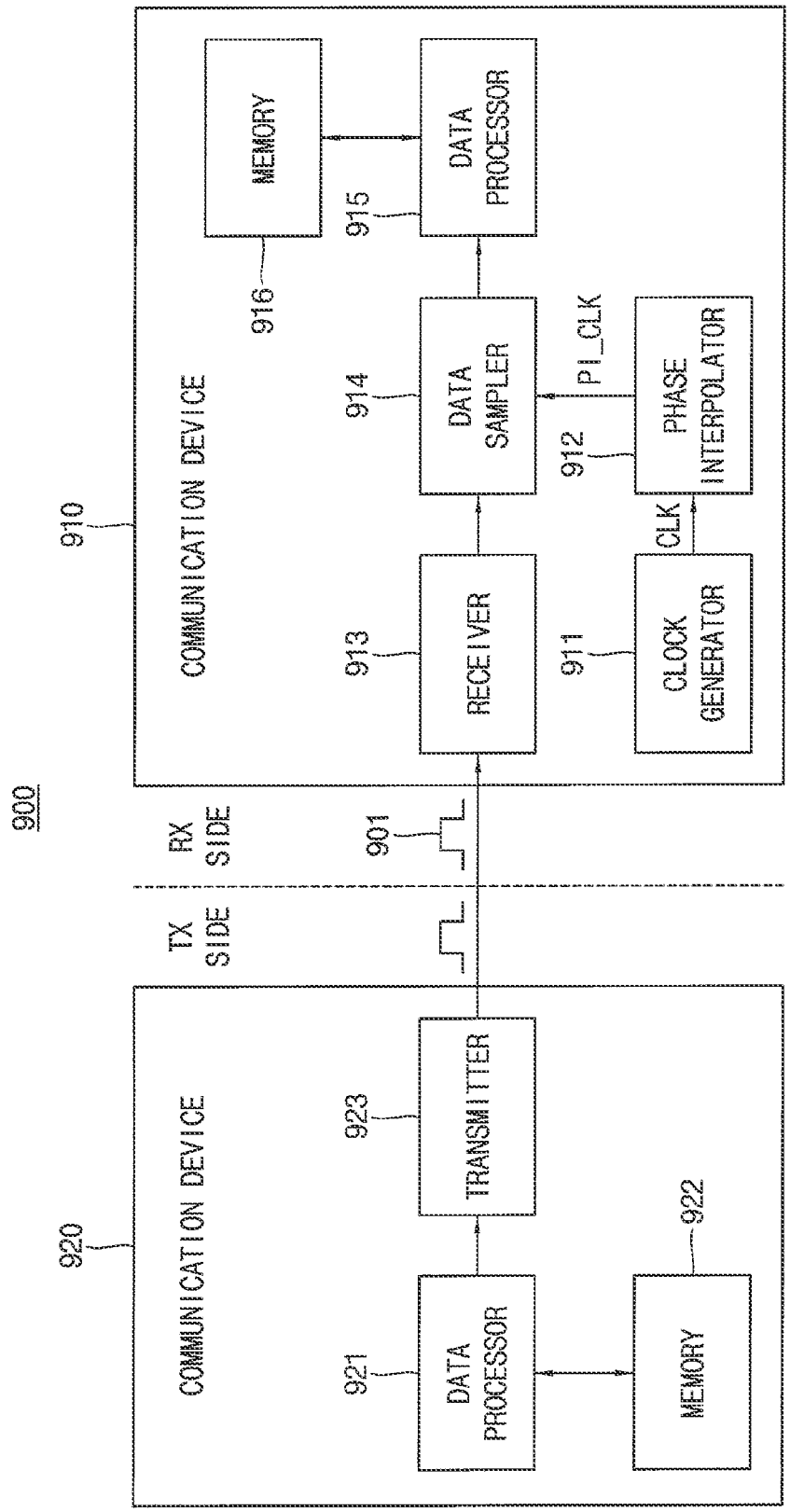
FIG. 15 is a block diagram illustrating a communication device and a communication system including the communication device according to example embodiments.

FIG. 15 is a block diagram illustrating a communication device and a communication system including the communication device according to example embodiments.

Referring to FIG. 15, a communication system 900 includes a communication channel 901, a first communication device 910 and a second communication device 920.

The first communication device 910 and the second communication device 920 may communicate with each other. Each of the first communication device 910 and the second communication device 920 may be a processing device including a computer, a network element (e.g., a router and switches), a portable communication device, or the like.

The first communication device 910 includes a phase interpolator 912 and a data sampler 914. The first communication device 910 may further include a clock generator 911, a receiver 913, a data processor 915, and a memory 916. The second communication device 920 may include a data processor 921, a memory 922, and a transmitter 923. For example, each of the data processors 915 and 921 may be a microprocessor, a central processing unit (CPU), or the like. For example, each of the memories 916 and 922 may include a dynamic random access memory (DRAM), a synchronous DRAM (SDRAM), a double data rate SDRAM (DDR SDRAM), a static access memory (SRAM), or the like.

In the second communication device 920, the data processor 921 may perform a data processing operation on data to be transmitted using the memory 922. The transmitter 923 may output the data on which the data processing operation is performed through the channel 901 in the form of a data stream.

In the first communication device 910, the receiver 913 may receive an input data stream and may provide the received input data stream to the data sampler 914. The clock generator 911 may generate a plurality of input clock signals CLK. For example, the clock generator 911 may include a phase locked loop (PLL) circuit and/or a delay locked loop (DLL) circuit. The phase interpolator 912 may generate a phase interpolation clock signal PI_CLK based on a phase interpolation code PI_CODE and the plurality of input clock signals CLK. The phase interpolator 912 may be the phase interpolator according to example embodiments and may be implemented as described with reference to FIGS. 1 through 14. The data sampler 914 may generate sample data by sampling the input data stream based on the phase interpolation clock signal PI_CLK. For example, the data sampler 914 may generate the sample data by performing a data sampling operation multiple times. The data processing unit 915 may perform a data processing operation on the sample data using the memory 916.

Figure 16:
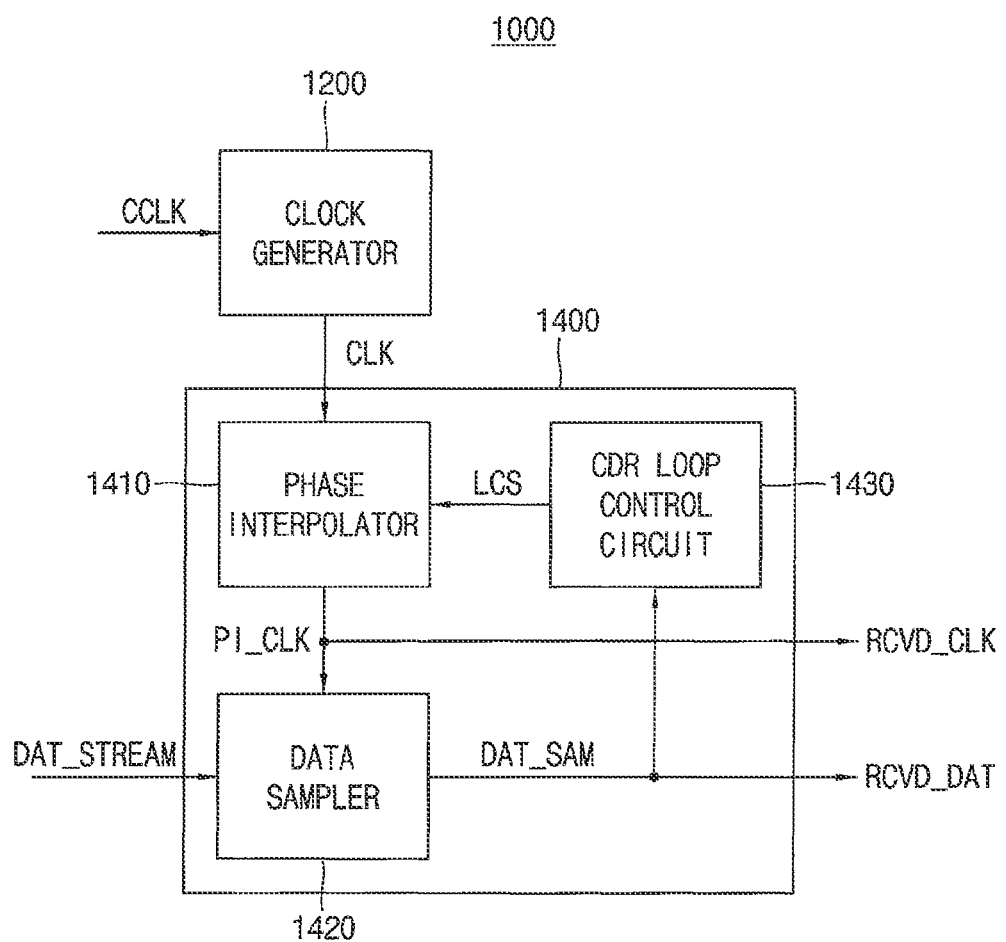
FIG. 16 is a block diagram illustrating a communication device according to example embodiments.

FIG. 16 is a block diagram illustrating a communication device according to example embodiments.

Referring to FIG. 16, a communication device 1000 may include a clock generator 1200 and a clock and data recovery (CDR) loop circuit 1400. For example, the communication device 1000 may be a CDR device. The CDR loop circuit 1400 may include a phase interpolator 1410, a data sampler 1420 and a CDR loop control circuit 1430.

The clock generator 1200 may generate a plurality of input clock signals CLK based on a crystal reference clock signal CCLK that is received from outside (e.g., from an oscillator located outside the communication device 1000). For example, the clock generator 1200 may include a PLL circuit and/or a DLL circuit. The phase interpolator 1410 may generate a phase interpolation clock signal PI_CLK based on a loop control signal LCS received from the CDR loop control circuit 1430, a phase interpolation code PI_CODE, and the plurality of input clock signals CLK. The phase interpolator 1410 may be the phase interpolator according to example embodiments and may be implemented as described with reference to FIGS. 1 through 14. The data sampler 1420 may receive an input data stream DAT_STREAM from an outside (e.g., from another communication device) and may perform a sampling operation on the input data stream DAT_STREAM based on the phase interpolation clock signal PI_CLK to generate sample data DAT_SAM.

The CDR loop control circuit 1430 may generate the loop control signal LCS based on a result of performing clock and data recovery operations. For example, the CDR loop control circuit 1430 may determine whether the phase interpolation clock signal PI_CLK generated from the phase interpolator 1410 is located in the center of the sample data DAT_SAM based on 4 phases sample data DAT_SAM. As a result of the determination, the CDR loop control circuit 1430 may generate the loop control signal LCS. Based on the above-described CDR loop operation, the phase interpolator 1410 may generate a recovery clock signal RCVD_CLK and may provide the recovery clock signal RCVD_CLK to the data sampler 1420. The data sampler 1420 may generate recovery data RCVD_DAT based on the recovery clock signal RCVD_CLK. As such, the CDR loop circuit 1400 may generate the recovery clock signal RCVD_CLK and the recovery data RCVD_DAT and may provide the recovery clock signal RCVD_CLK and the recovery data RCVD_DAT to a processor of the communication device 1000 (not illustrated).

The disclosure may be applied to various electronic devices and systems that include the phase interpolators and the communication devices. For example, the disclosure may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A phase interpolator comprising:
    a decoder configured to generate a first thermometer code, a second thermometer code and, a selection signal based on a phase interpolation code;
    a digital-to-analog converter (DAC), including a plurality of unit cells that are arranged in a matrix formation including a plurality of rows and a plurality of columns, configured to determine two of a plurality of weight signals as a first target weight signal and a second target weight signal based on the selection signal, and configured to adjust an amount of current of the first and second target weight signals by controlling the plurality of unit cells based on the first and second thermometer codes and the selection signal; and
    a phase mixer configured to determine two of a plurality of input clock signals as a first target clock signal and a second target clock signal corresponding to the first and second target weight signals, and configured to generate an output clock signal based on the first and second target weight signals and the first and second target clock signals, wherein a phase of the output clock signal is between phases of the first and second target clock signals, wherein:

the plurality of unit cells include first unit cells and a second unit cell that differs from the first unit cells, the first unit cells are configured to operate based on all of the first and second thermometer codes and the selection signal, and the second unit cell is configured to operate based on only the selection signal.

2. The phase interpolator of claim 1, wherein:

the plurality of unit cells are always turned on, and each of the plurality of unit cells is assigned to one of the first and second target weight signals based on at least one of the first and second thermometer codes and the selection signal.

3. The phase interpolator of claim 1, wherein when the number of the plurality of unit cells is J, the number of the first unit cells is (J-1), where J is a natural number greater than or equal to four.

4. The phase interpolator of claim 1, wherein:

a number of the plurality of input clock signals and a number of the plurality of weight signals are 2K, where K is a natural number greater than or equal to one, a number of bits of the selection signal is K, and a number of bits of the first thermometer code and a number of bits of the second thermometer code are determined based on a number of the plurality of unit cells.

5. The phase interpolator of claim 1, wherein:

the plurality of input clock signals include a first input clock signal, a second input clock signal, a third input clock signal, and a fourth input clock signal in which two adjacent input clock signals have a phase difference of 90 degrees from each other, the plurality of weight signals include a first weight signal, a second weight signal, a third weight signal, and a fourth weight signal that correspond to the first input clock signal, the second input clock signal, the third input clock signal and the fourth input clock signal, respectively, the selection signal includes a first selection bit and a second selection bit, the first thermometer code includes a plurality of row bits, and the second thermometer code includes a plurality of column bits.

6. The phase interpolator of claim 5, wherein the second unit cell includes:

a current source;

a weight selection signal generator configured to generate a first weight selection signal, a second weight selection signal, a third weight selection signal, and a fourth weight selection signal that correspond to the first weight signal, the second weight signal, the third weight signal and the fourth weight signal, respectively, based on the first selection bit and the second selection bit; and a current supplier configured to provide an output of the current source to one of the first, second, third, and fourth weight signals based on the first, second, third, and fourth weight selection signals.

7. A communication device comprising:

a phase interpolator configured to generate a phase interpolation clock signal based on a phase interpolation code and a plurality of input clock signals; and a data sampler configured to generate sample data by sampling an input data stream based on the phase interpolation clock signal, wherein:

the phase interpolator includes:

a decoder configured to generate a first thermometer code, a second thermometer code, and a selection signal based on the phase interpolation code;

a digital-to-analog converter (DAC) including a plurality of unit cells that are arranged in a matrix formation including a plurality of rows and a plurality of columns, configured to determine two of a plurality of weight signals as a first target weight signal and a second target weight signal based on the selection signal, and configured to adjust an amount of current of the first and second target weight signals by controlling the plurality of unit cells based on the first and second thermometer codes and the selection signal; and a phase mixer configured to determine two of the plurality of input clock signals as a first target clock signal and a second target clock signal corresponding to the first and second target weight signals and configured to generate the phase interpolation clock signal based on the first and second target weight signals and the first and second target clock signals, wherein a phase of the phase interpolation clock signal is between phases of the first and second target clock signals, the plurality of unit cells include-a first unit cells and a second unit cell that are different types, the first unit cells are configured to operate based on all of the first and second thermometer codes and the selection signal, and the second unit cell is configured to operate based on only the selection signal.

8. The communication device of claim 7, further comprising:

a clock generator configured to generate the plurality of input clock signals; and a data processor configured to perform a data processing operation on the sample data.

9. A phase interpolator comprising:

a decoder that generates a first thermometer code, a second thermometer code, and a quadrant code based on a phase interpolation code;

a digital-to-analog converter (DAC) including current sources that are arranged in a matrix formation of rows and columns, wherein the DAC determines a first current provided by a first combination of the current sources and a second current provided by a second combination of the current sources, differing from the first combination of current sources, based on the first thermometer code, the second thermometer code, and the quadrant code; and a phase mixer that generates an output clock signal based on a first clock signal, a second clock signal, the first current, and the second current, wherein:

the DAC contributes a current from a first current source, among the current sources, based solely on the quadrant code, and the DAC contributes a current from each of a first group of the current sources based on each of the first thermometer code, the second thermometer code, and the quadrant code.

10. The phase interpolator of claim 9, wherein the quadrant code determines whether the phase of the output clock signal is between 0 and 90 degrees, 90 and 180 degrees, 180 and 270 degrees, or 270 and 0 degrees.

11. The phase interpolator of claim 9, wherein the quadrant code determines which of a plurality of clock signals, each having a different phase from the others, is used as the first clock signal and which is used as the second clock signal.

12. The phase interpolator of claim 11, wherein the phase of the output clock signal is between a phase of the first clock signal and a phase of the second clock signal.

13. The phase interpolator of claim 9, wherein the phase of the output clock signal is between a phase of the first clock signal and a phase of the second clock signal.

14. The phase interpolator of claim 13, wherein the phase of the output clock signal is determined based on a difference between the first current and the second current.

15. The phase interpolator of claim 14, wherein:
each of the first thermometer code, the second thermometer code, and the quadrant code are represented in binary, and
the smallest increment/decrement in the phase of the output clock signal achievable by the phase mixer is produced by a first combination of the first thermometer code, the second thermometer code, and the quadrant code having a single binary digit differing from a second combination of the first thermometer code, the second thermometer code, and the quadrant code.

16. The phase interpolator of claim 13, wherein the first thermometer code identifies all rows, within the matrix formation, of the first group of current sources.

17. The phase interpolator of claim 13, wherein the second thermometer code identifies all columns, within the matrix formation, of the first group of current sources.

* * * * *